US007705358B2

(12) United States Patent
Okamoto et al.

(10) Patent No.: US 7,705,358 B2
(45) Date of Patent: Apr. 27, 2010

(54) SEMICONDUCTOR DEVICE AND METHOD OF MANUFACTURING THE SAME

(75) Inventors: Satoru Okamoto, Kanagawa (JP); Keiichi Sekiguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 11 days.

(21) Appl. No.: 11/957,270

(22) Filed: Dec. 14, 2007

(65) Prior Publication Data

US 2008/0150027 A1 Jun. 26, 2008

(30) Foreign Application Priority Data

Dec. 20, 2006 (JP) ............................. 2006-343412

(51) Int. Cl.
*H01L 27/14* (2006.01)

(52) U.S. Cl. ........................... 257/72; 257/59; 257/270; 257/344; 257/350; 257/384; 257/391; 257/408; 257/E27.111; 257/E29.255; 257/E29.278; 257/E29.279

(58) Field of Classification Search ................. 257/384, 257/344, 391, 270, 408, 59, 72, 350, E29.255, 257/E29.278, E29.279, E27.111
See application file for complete search history.

(56) References Cited

U.S. PATENT DOCUMENTS

| | | | |
|---|---|---|---|
| 5,292,675 | A | 3/1994 | Codama |
| 5,403,772 | A | 4/1995 | Zhang et al. |
| 5,426,064 | A | 6/1995 | Zhang et al. |
| 5,576,556 | A | 11/1996 | Takemura et al. |
| 5,595,944 | A | 1/1997 | Zhang et al. |
| 5,639,698 | A | 6/1997 | Yamazaki et al. |
| 5,644,147 | A | 7/1997 | Yamazaki et al. |
| 5,648,277 | A | 7/1997 | Zhang et al. |
| 5,807,770 | A | 9/1998 | Mineji |
| 5,814,540 | A | 9/1998 | Takemura et al. |
| 5,818,070 | A | 10/1998 | Yamazaki et al. |
| 5,897,347 | A | 4/1999 | Yamazaki et al. |
| 5,915,204 | A | 6/1999 | Sumi |
| 5,923,968 | A | 7/1999 | Yamazaki et al. |
| 5,956,579 | A | 9/1999 | Yamazaki et al. |
| 5,962,897 | A | 10/1999 | Takemura et al. |

(Continued)

FOREIGN PATENT DOCUMENTS

| | | |
|---|---|---|
| JP | 03-20046 | 1/1991 |

(Continued)

*Primary Examiner*—Long K Tran
(74) *Attorney, Agent, or Firm*—Fish & Richardson P.C.

(57) ABSTRACT

It is an object to improve operation characteristics and reliability of a semiconductor device. A semiconductor device which includes an island-shaped semiconductor film having a channel-formation region, a first low-concentration impurity region, a second low-concentration impurity region, and a high-concentration impurity region including a silicide layer; a gate insulating film; a first gate electrode overlapping with the channel-formation region and the first low-concentration impurity region with the gate insulating film interposed therebetween; a second gate electrode overlapping with the channel-formation region with the gate insulating film and the first gate electrode interposed therebetween; and a sidewall formed on side surfaces of the first gate electrode and the second gate electrode. In the semiconductor device, a thickness of the gate insulating film is smaller in a region over the second low-concentration impurity region than in a region over the first low-concentration impurity region.

6 Claims, 18 Drawing Sheets

128 122 128 120 129 d5 d4 d2 d3 d1 133a 134a 124a 126 124b 134b 133b 601a 601b 601c

U.S. PATENT DOCUMENTS 5,986,286 A 11/1999 Yamazaki et al.
6,048,791 A 4/2000 Katata et al.
6,049,092 A 4/2000 Konuma et al.
6,074,900 A 6/2000 Yamazaki et al.
6,162,704 A 12/2000 Yamazaki et al.
6,204,170 B1 3/2001 Taguwa
6,218,678 B1 4/2001 Zhang et al.
6,259,138 B1 7/2001 Ohtani et al.
6,274,887 B1 8/2001 Yamazaki et al.
6,303,963 B1 10/2001 Ohtani et al.
6,353,244 B1 3/2002 Yamazaki et al.
6,355,512 B1 3/2002 Yamazaki et al.
6,365,917 B1 4/2002 Yamazaki
6,369,410 B1 4/2002 Yamazaki et al.
6,372,655 B2 4/2002 Khan et al.
6,452,277 B1 9/2002 Tabaru et al.
6,455,875 B2 9/2002 Takemura et al.
6,475,839 B2 11/2002 Zhang et al.
6,531,713 B1 3/2003 Yamazaki
6,545,359 B1 4/2003 Ohtani et al.
6,596,571 B2 7/2003 Arao et al.
6,605,496 B1 8/2003 Yamazaki
6,611,108 B2 8/2003 Kimura
6,613,614 B2 9/2003 Yamazaki et al.
6,617,612 B2 9/2003 Zhang et al.
6,624,477 B1 9/2003 Takemura et al.
6,646,287 B1 11/2003 Ono et al.
6,646,692 B2 11/2003 Yamazaki et al.
6,670,640 B1 12/2003 Yamazaki et al.
6,690,437 B2 2/2004 Yamazaki et al.
6,706,544 B2 3/2004 Yamazaki et al.
6,737,306 B2 5/2004 Yamazaki et al.
6,747,289 B2 6/2004 Yamazaki et al.
6,759,678 B2 7/2004 Yamazaki et al.
6,773,944 B2 8/2004 Okamoto
6,773,996 B2 8/2004 Suzawa et al.
6,777,275 B1 8/2004 Kluth
6,790,749 B2 9/2004 Takemura et al.
6,794,229 B2 9/2004 Asami et al.
6,809,339 B2 10/2004 Suzawa et al.
6,825,488 B2 11/2004 Yamazaki et al.
6,847,341 B2 1/2005 Kimura et al.
6,867,431 B2 3/2005 Konuma et al.
6,882,018 B2 4/2005 Ohtani et al.
7,087,962 B1 8/2006 Codama
7,115,517 B2 10/2006 Ye et al.
7,151,015 B2 12/2006 Suzawa et al.
7,161,177 B2 1/2007 Suzawa et al.
7,223,666 B2 5/2007 Ohtani et al.
7,238,600 B2 7/2007 Yamazaki et al.
7,288,480 B2 10/2007 Yamaguchi et al.
7,344,825 B2 3/2008 Nagai et al.
7,391,054 B2 * 6/2008 Yamazaki et al. ............. 257/69
7,435,685 B2 10/2008 Delgadino et al.
2001/0034088 A1 10/2001 Nakamura et al.
2002/0011627 A1 1/2002 Takemura et al.
2002/0025591 A1 2/2002 Ohnuma et al.
2002/0094612 A1 7/2002 Nakamura et al.
2003/0006414 A1 1/2003 Takemura et al.
2003/0164912 A1 9/2003 Eguchi et al.
2004/0091820 A1 5/2004 Nagai et al.
2004/0256621 A1 12/2004 Konuma et al.
2005/0037549 A1 2/2005 Takemura et al.
2005/0042785 A1 2/2005 Okamoto
2005/0055494 A1 3/2005 Doris et al.
2005/0059236 A1 3/2005 Nishida et al.
2005/0074977 A1 4/2005 Kumihashi et al.
2005/0112817 A1 5/2005 Cheng et al.
2005/0142705 A1 6/2005 Konuma et al.
2005/0153489 A1 7/2005 Konuma et al.
2005/0173024 A1 8/2005 Brennan et al.
2005/0227419 A1 10/2005 Okamoto
2005/0241952 A1 11/2005 Okamoto
2006/0091398 A1 5/2006 Yamaguchi et al.
2006/0115948 A1 6/2006 Tokunaga
2006/0197088 A1 9/2006 Isobe et al.
2006/0244063 A1 * 11/2006 Isobe et al. ................. 257/347
2006/0267097 A1 11/2006 Codama
2007/0111424 A1 5/2007 Suzawa et al.
2007/0194323 A1 * 8/2007 Takano et al. ................. 257/72
2007/0210451 A1 9/2007 Ohtani et al.
2008/0182209 A1 7/2008 Nagai et al.

FOREIGN PATENT DOCUMENTS

JP 06-124962 5/1994
JP 08-078329 3/1996
JP 08-250739 9/1996
JP 10-098199 4/1998
JP 2004-179330 6/2004
JP 2004-221115 8/2004
JP 2006-156971 6/2006

* cited by examiner d3
d2
d1
d5
d4
120
128
122
128
129
133b
601c
134b
601b
124b
126
601a
124a
134a
133a

SEMICONDUCTOR DEVICE AND METHOD OF MANUFACTURING THE SAME

BACKGROUND OF THE INVENTION

1. Field of the Invention

The present invention relates to semiconductor devices and a method of manufacturing the semiconductor devices.

2. Description of the Related Art

Recently, various types of circuits are often formed using thin film transistors (hereinafter, referred to as TFTs) over one substrate. In order to form various circuits using TFTs, attention should be given to that TFTs having different structures each of which corresponds to each of the circuits should be formed. This is because, considering the case of a display device, operating conditions of a TFT in a pixel portion and those of a TFT in a drive circuit are not always the same, and characteristics of TFTs which should also be different.

TFTs in a pixel portion which includes n-channel TFTs apply voltage to and drive liquid crystal as switching elements. The TFT in a pixel portion needs to have a sufficiently low OFF current value in order to hold charge accumulated in a liquid crystal layer during one frame period. On the other hand, since a buffer circuit and the like in a driver circuit are applied with a high drive voltage, it is necessary to increase a withstand voltage so that elements in the driver circuit are not broken even when the elements in the driver circuit are applied with high voltage. In addition, in order to enhance ON current drive capability, it is necessary to secure a sufficient ON current value.

As a structure of a TFT which reduces the OFF current value, a structure having a low-concentration impurity region (hereinafter also referred to as an LDD (lightly-doped drain) region) is given. Such a structure has a region to which an impurity element is added at a low concentration between a channel formation region and a source region or a drain region to which an impurity element is added at a high concentration.

Further, as a means for preventing degradation in ON current value due to hot carriers, there is a structure in which an LDD region is formed to overlap with a gate electrode with a gate insulating film interposed therebetween (such a structure is referred to as a gate overlapped LDD (GOLD) structure in this specification). With such a structure, a high electric field in the vicinity of a drain is relieved; therefore, degradation in ON current value due to hot carriers can be decreased. Note that in this specification, a region in an LDD region which does not overlap with the gate electrode with a gate insulating film interposed therebetween is referred to as an Loff region, while a region in the LDD region which overlaps with the gate electrode with the gate insulating film interposed therebetween is referred to as an Lov region.

Note that the Loff region have high effect on suppressing the OFF current value, whereas the Loff region has low effect on preventing degradation in the ON current value due to hot carriers by relieving the electric field in the vicinity of the drain. On the other hand, the Lov region works effectively in preventing degradation in ON current value by relieving the electric field in the vicinity of the drain; however, it does not work effectively in suppressing the OFF current value. Thus, it is necessary to form a TFT having a structure having characteristics in need for each of the various circuits.

Further, as to On current, there is also a method in which a contact resistance, which is parasitic resistance of a TFT, is decreased so that ON current is increased. In specific, nickel silicide is provided in a source region and a drain region to decrease contact resistance with a wiring (for example, see Patent Document 1: Japanese Published Patent Application No. 2006-156971).

SUMMARY OF THE INVENTION

In a structure described in Patent Document 1, impurity concentration is difficult to be controlled in a region in an LDD region which does not overlap with a gate electrode with a gate insulating film interposed therebetween (an Loff region).

In view of the foregoing, it is an object of the present invention to control an impurity concentration in an Loff region in a miniaturized TFT. In addition, it is another object to improve operation characteristics and reliability of a semiconductor device by making a structure of a TFT appropriate in accordance with function of each of various types of circuits, even in a miniaturized TFT. Further in addition, it is another object to reduce the number of steps in order to reduce manufacturing cost and improve yields.

In the present invention, a thickness of gate insulating film is made smaller over an Loff region in an LDD region; thus, an impurity concentration in the Loff region is controlled.

A conductive film to serve as a gate electrode is overetched, so that a part of a gate insulating film which is outside the gate electrode is etched; thus, a thickness of the gate insulating film is made small over an Loff region. When an impurity which has passed through the gate insulating film with a reduced thickness is added to a semiconductor film, impurity concentration can reach its peak in a lower layer in the semiconductor film or lower than the semiconductor film. Therefore, impurity concentration in the semiconductor film is reduced. Accordingly, off current (I off) can be reduced.

Note that overetching refers to etching treatment in which etching is kept conducted, successively or under a changed etching condition in order not to leave residue between necessary patterns in an etching step, after etching is conducted for a just etching time which is determined by calculation in accordance with etching rate and a film thickness or after etching is conducted until change in plasma light emission intensity is detected (a time taken for this etching is also referred to as a just etching time).

Note that in this specification, a gate electrode which has a stack-layer structure including at least two layers, in which a gate length (a length in a channel length direction) of a lower gate electrode is longer than a gate length (a length in a channel length direction) of an upper gate electrode and the upper gate electrode is thicker than the lower gate electrode is referred to as "a hat-shaped gate electrode" for convenience. The lower gate electrode may have a cross-sectional shape which is widen towards the bottom or a rectangle.

In this specification, a semiconductor device refers to an element and device in general, which operates by utilizing characteristic of the semiconductor, and thin film transistors, wireless chips, display devices, and electronic appliances are included in the category.

Since a semiconductor device of the present invention has an Loff region, off current thereof can be reduced. A thickness of a gate insulating film is made smaller over the Loff region by overetching in formation of a gate electrode and a profile of an impurity concentration in the Loff region reaches its peak under the semiconductor film. Therefore, the dose in the Loff region can be small, and the off current can be more reduced. On the other hand, the gate insulating film is thick over an Lov region and a channel formation region. In addition, a semiconductor device of the present invention has an Lov region; therefore, hot carrier deterioration can be prevented and the reliability is improved.

According to the present invention, a semiconductor device having favorable operating characteristics and high reliability can be realized even when it is miniaturized, and plural different types of semiconductor devices suitable for various circuits can be formed. In addition, since semiconductor devices having various structures can be manufactured through a process having a small number of reduced manufacturing steps, a manufacturing cost can be reduced and the yield can be improved.

In addition, silicide is formed in a part of a semiconductor film, and a wiring and the semiconductor film are connected through the silicide; therefore, contact resistance can be lowered. Accordingly, an ON current can be increased, and a favorable ON current can be obtained even in a miniaturized TFT having an LDD region.

Further, a submicron TFT having a favorable size can be formed without limitation in size, so that a semiconductor device itself can be quite small and lightweight. In addition, an LDD length suitable for individual TFT can be designed, so that a semiconductor device which can suppress short channel effect and increase a withstand voltage as well as secure favorable ON current can be obtained.

By adding an impurity element using a hat-shaped gate electrode of the present invention as a mask, an LDD region which has a quite short LDD length of 10 to 300 nm, preferably, 50 to 200 nm can be formed. In specific, a length of the Lov region in the channel length direction (an Lov length) can be 20 to 200 nm, and a length of the Loff region in the channel length direction (an Loff length) can be 30 to 500 nm. In addition, in a minute TFT having a channel length of 0.1 to 1.0 μm, a TFT having an LDD region suitable for the size can be formed.

DETAILED DESCRIPTION OF THE INVENTION

Figure 1A:
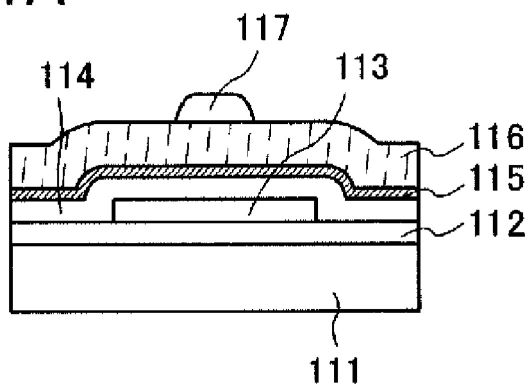
FIGS. 1A to 1D illustrate a method of manufacturing a semiconductor device according to an aspect of the present invention.

Hereinafter, embodiment modes and an embodiment of the present invention are described with reference to the drawings. Note that the present invention can be carried out in many different modes, and it is easily understood by those skilled in the art that modes and details can be modified in various ways without departing from the purpose and the scope of the present invention. Accordingly, the present invention should not be interpreted as being limited to the description of the embodiment modes and the embodiment.

Embodiment modes and an embodiment described below can be arbitrarily combined within a practicable range.

Embodiment Mode 1

Hereinafter, a method of manufacturing a semiconductor device according to this embodiment mode is described with reference to FIGS. 1A to 1D, 2A to 2H, and 6A and 6B.

First, a base insulating film 112 is formed to have a thickness of 100 to 300 nm over a substrate 111. As the substrate 111, an insulating substrate such as a glass substrate, a quartz substrate, a plastic substrate, or a ceramic substrate; a metal substrate; a semiconductor substrate; or the like can be used.

The base insulating film 112 can be formed to have a single layer structure of an insulating film containing oxygen and/or nitrogen such as silicon oxide ($SiO_x$), silicon nitride ($SiN_x$), silicon oxide containing nitrogen ($SiO_xN_y$) (x>y), or silicon nitride containing oxygen ($SiN_xO_y$) (x>y). The base insulating film 112 can alternatively have a stack-layer structure including any of those films. In particular, the base insulating film is preferably formed when impurities from the substrate are concerned.

When the base insulating film 112 has a stack-layer structure, it is preferable that a part of the base insulating film 112 which is in contact with a semiconductor film be a silicon nitride film or a silicon nitride film containing oxygen, having a thickness of 10 to 200 nm, preferably, 50 to 150 nm. When a crystallization method in which a metal element is added into the semiconductor film is used in a subsequent crystallization step, the metal element should be gettered. In that case, if the base insulating film is a silicon oxide film, at an interface between the silicon oxide film and the semiconductor film which is a silicon film, a metal element in the silicon film and oxygen in the silicon oxide film react with each other to make metal oxide, and thus the metal element may become difficult to be gettered. Thus, it is preferable that a silicon oxide film be not used for the part of the base insulating film which is in contact with the semiconductor film. In this embodiment mode, the base insulating film 112 has a stack-layer including a silicon nitride film containing oxygen which is formed to have a thickness of 50 nm and a silicon oxide film containing nitrogen which is formed to have a thickness of 100 nm.

Then, the semiconductor film is formed to have a thickness of 10 to 100 nm. A material for the semiconductor film can be selected in accordance with required characteristics of a TFT, and any of a silicon film, a silicon germanium film, or a silicon carbide film may be used. As the semiconductor film, a crystalline semiconductor film which is formed by forming an amorphous semiconductor film or a microcrystalline semiconductor film (e.g., microcrystalline silicon film or a semi-amorphous silicon film) and by crystallizing such a film by a laser crystallization method is preferably used. The microcrystalline semiconductor film can be obtained by glow discharge decomposition of a gas containing silicon such as $SiH_4$. The gas containing silicon may be diluted with hydrogen or fluorine, or with any of the rare gas elements and hydrogen or fluorine, so that the microcrystalline semiconductor film can be easily formed.

A semiamorphous semiconductor film which is typified by a semiamorphous silicon film contains a semiconductor having an intermediate structure between an amorphous semiconductor and a semiconductor having a crystalline structure (including a single crystal structure and a polycrystalline structure). The semiamorphous semiconductor film is a semiconductor film having a third condition that is stable in term of free energy, and is a crystalline substance having a short-range order and lattice distortion. A crystal grain thereof having a grain size of 0.5 to 20 nm can be dispersed in the non-single crystal semiconductor film. Raman spectrum of the semiamorphous semiconductor film is shifted toward lower wave number than 520 $cm^{-1}$. The diffraction peaks of (111) and (220), which are thought to be derived from a Si crystal lattice, are observed in the semiamorphous semiconductor by X-ray diffraction. The semiamorphous semiconductor film contains hydrogen or halogen at least 1 at. % or more for terminating a dangling bond. Such a semiconductor film is referred to as a semiamorphous semiconductor (SAS) film for convenience in this specification. The lattice distortion is further extended by adding a rare gas element such as helium, argon, krypton, and neon so that the favorable semi-amorphous semiconductor film with improved stability can be obtained.

The SAS film can be obtained by glow discharge decomposition of a gas containing silicon. For a typical gas containing silicon, $SiH_4$ is given, and $Si_2H_6$, $SiH_2Cl_2$, $SiHCl_3$, $SiCl_4$, $SiF_4$, or the like can also be used. The gas containing silicon may be diluted with hydrogen or with a gas in which one or more of rare gas elements of helium, argon, krypton, or neon is/are added to hydrogen; therefore, the SAS film can be easily formed. It is preferable that the gas containing silicon be diluted at a dilution rate in the range of 2 to 1000 times. Further, a carbide gas such as $CH_4$ or $C_2H_6$, a germanium gas such as $GeH_4$ or $GeF_4$, $F_2$, or the like may be mixed into the gas containing silicon so as to adjust the energy bandwidth to be from 1.5 to 2.4 eV or 0.9 to 1.1 eV.

In addition, it is also possible to employ a crystallization method with laser irradiation, a rapid thermal annealing (RTA) method using a halogen lamp, or a crystallization technique using a heating furnace as a crystallization technique. Further, a method may also be used in which a metal element such as nickel is added into the amorphous semiconductor film and the amorphous semiconductor film is subjected to solid-phase growth using the added metal as a crystal nucleus.

A laser includes a laser medium, an excitation source, and a resonator. When lasers are classified by laser medium, there are a gas laser, a liquid laser, and a solid laser; when lasers are classified by oscillation characteristic, there are a free electron laser, a semiconductor laser, and an x-ray laser. Any of the lasers may be used. Note that a gas laser or a solid laser is preferably used, and more preferably, a solid laser is used.

As a gas laser, there are a helium-neon laser, a carbon dioxide gas laser, an excimer laser, an argon ion laser, and the like. An excimer laser includes a rare gas excimer laser and a rare gas halide excimer laser. A rare gas excimer laser oscillates by excited molecules of argon, krypton, or xenon. A gas laser includes a metal vapor ion laser.

A liquid laser includes an inorganic liquid laser, an organic chelate laser, and a pigment laser. In an inorganic liquid laser and an organic chelate laser, rare earth ions such as neodymium, which are utilized for a solid laser, are used as a laser medium.

A laser medium used in a solid laser is a solid base doped with active species functioning as a laser. The solid base is a crystal or glass. The crystal is YAG (yttrium aluminum garnet crystal), YLF, $YVO_4$, $YAlO_3$, sapphire, ruby, or alexandrite. In addition, the active species functioning as a laser are, for example, trivalent ions (such as $Cr^{3+}$, $Nd^{3+}$, $Yb^{3+}$, $Tm^{3+}$, $Ho^{3+}$, $Er^{3}+$, or $Ti^{3}+$).

Note that as a laser which is used for crystallizing the semiconductor film by laser irradiation, a continuous wave laser or a pulsed wave laser can be used. An irradiation condition of a laser beam (e.g., repetition rate, power density, energy density, and a beam profile) is appropriately adjusted in consideration of the thickness, the material, or the like of the semiconductor film.

In this embodiment mode, an amorphous silicon film is formed to have a thickness of 66 nm, the amorphous silicon film is heated at 500° C. for 1 hour and then, is heated at 550° C. for 4 hours. Further, the film is irradiated with a continuous wave laser (also referred to as a CW laser) for laser crystallization. In this manner, a crystalline silicon film is formed.

Then, the semiconductor film is etched using a photolithography technique, so that an island-shaped semiconductor film 113 is formed. Then, boron (B) may be added to the island-shaped semiconductor film 113. Next, a gate insulating film 114 may be formed to have a thickness of 20 to 200 nm, preferably 20 to 50 nm to cover the island-shaped semiconductor film 113.

The gate insulating film 114 may have a stack-layer structure by appropriately combining any of a film of silicon oxide ($SiO_x$), silicon nitride ($SiN_x$), silicon oxide containing nitrogen ($SiO_xN_y$) (x>y), silicon nitride containing oxygen ($SiN_xO_y$) (x>y) or the like formed by a CVD method or a sputtering method. In this embodiment mode, the gate insulating film 114 is a film of silicon oxide containing nitrogen having a thickness of 20 nm.

Next, a first conductive film 115 and a second conductive film 116, which are to serve as a gate electrode, are formed over the gate insulating film 114. First, the first conductive film 115 is formed to have a thickness of 5 to 50 nm. As the first conductive film 115, an aluminum (Al) film, a copper (Cu) film, a film containing aluminum or copper as its main component, a chromium (Cr) film, a tantalum (Ta) film, a tantalum nitride film, a titanium (Ti) film, a tungsten (W) film, a molybdenum (Mo) film, or the like can be used. The second conductive film 116 is formed thereover to have a thickness of 150 to 500 nm. As the second conductive film 116, for example, a chromium (Cr) film, a tantalum (Ta) film, a film containing tantalum as its main component, a tungsten (W) film, a titanium (Ti) film, an aluminum (Al) film, or the like can be used. Note that the first conductive film 115 and the second conductive film 116 are required to be a combination in which a selective ratio can be high in each of etching of the first conductive film 115 and etching of the second conductive film 116. As a combination of the first conductive film and the second conductive film, in which a selective ratio is high in each of etchings of the conductive films can employ, for example, aluminium and tantalum, aluminium and titanium, or tantalum nitride and tungsten, for the first conductive film and the second conductive film, respectively. In this embodiment mode, the first conductive film 115 is a tantalum nitride film having a thickness of 30 nm, and the second conductive film 116 is a tungsten (W) film having a thickness of 370 nm.

Next, a first resist 117 is formed over the second conductive film 116 by a photolithography technique using a photo mask (see FIG. 1A). The first resist 117 may be formed in a shape with a side surface having a taper angle. When the first resist 117 has a taper angle, the second conductive film can be etched to be a third conductive film 118 having a taper angle θ in a first etching that is a following step. In addition, by providing the taper angle on the side surface of the first resist 117, a reaction product in the first etching can be prevented from attaching to the side surface of the first resist 117 and growing. Further, by conducting heat treatment to the first resist 117, the first resist 117 may also be formed so as to have a symmetrical cross-sectional shape having the same taper angles on opposing side surfaces of the resist.

Figure 1B:
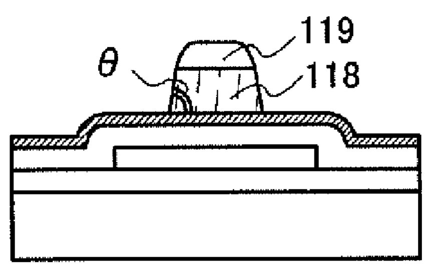

Then, the first etching is conducted using the first resist 117 as a mask (see FIG. 1B). In the first etching, the second conductive film 116 is etched to form the third conductive film 118, which is the etched second conductive film. At this time, it is preferable to conduct etching under an etching condition with a high selective ratio of the third conductive film 118 to the first conductive film 115 in order not to etch the first conductive film 115 and not to expose the gate insulating film 114. Note that the first resist 117 is also etched to be a second resist 119. However, a width of a recess of the first resist 117 to the second resist 119 is not shown in the drawing. At this time, the side surface of the third conductive film 118, which is the etched second conductive film, has a taper angle θ of 80°≧θ90°, which is nearly a perpendicular taper angle.

In the first etching, a mixed gas of $Cl_2$, $SF_6$, and $O_2$ is used as an etching gas, and the flow rates of $Cl_2$, $SF_6$, and $O_2$ are 33 sccm, 33 sccm, and 10 sccm, respectively. Plasma is generated by adjusting pressure to be 0.67 Pa and applying a power of 2000 W to a coil-shaped electrode. A power of 50 W is applied to a substrate side (a sample stage). Power on a substrate side may be appropriately changed in accordance with a level of the etching, and may be 200 W.

Figure 1C:
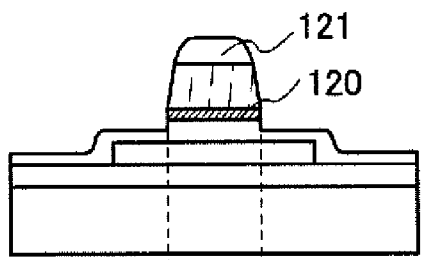

Next, a second etching is conducted to the first conductive film 115 using the third conductive film 118, which is the etched second conductive film, as a mask (see FIG. 1C). By the second etching, the first conductive film 115 is processed to be a first gate electrode 120. At this time, by overetching, a part of the gate insulating film 114 which is a region not under the first gate electrode 120 is etched and a thickness thereof is reduced. On the other hand, a part of the gate insulating film 114 which is under the first gate electrode 120 is not etched and has the same thickness as the gate insulating film originally formed. In the second etching condition, plasma is generated by applying a power of 2000 W to a coil-shaped electrode at pressure of 0.67 Pa, and then, a power of 50 W is applied to the substrate side (the sample stage). An etching gas is $Cl_2$. Note that the second resist 119 is also etched and recessed to be a third resist 121; although the recess is not shown in the drawing.

Note that the second etching may be conducted under a condition in which the gate insulating film 114 is not etched. In this case, the thickness of the gate insulating film 114 is not changed as shown in FIG. 6A.

Figure 1D:
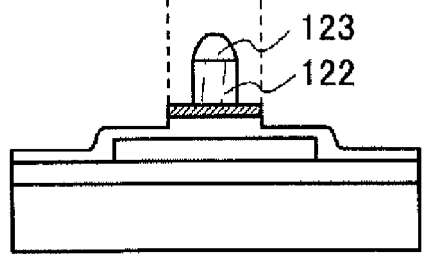

Then, a third etching is conducted (see FIG. 1D). In the third etching condition, plasma is generated by applying a power of 2000 W to a coil-shaped electrode at pressure of 1.33 Pa. Power is not applied to the substrate side (sample stage). An etching gas is a mixed gas of $Cl_2$, $SF_6$, and $O_2$, and the flow rates of $Cl_2$, $SF_6$, and $O_2$ are 22 sccm, 22 sccm, and 30 sccm, respectively. In the third etching, the third resist 121 is recessed. At the same time, the length of the third conductive film 118, which is the etched second conductive film, in the channel length direction is shortened using the recessed third resist 121 as a mask to form a second gate electrode 122. In addition, the gate insulating film 114 is further etched to be thinner than that shown in FIG. 1C. Accordingly, the thickness of the gate insulating film 114 is large under the second gate electrode 122 and is small under a region in which the second gate electrode 122 is not formed. Note that the recessed third resist 121 becomes a fourth resist 123. Then, the fourth resist 123 is removed.

In the third etching, a side surface of the second gate electrode 122 is easily etched. When the side surface of the second gate electrode 122 is etched, the gate length (the length in a channel length direction) in the middle portion of the second gate electrode 122 gets shorter than that of the top portion or the bottom portion; thus, a cross-section of the second gate electrode 122 has a shape constricted in the middle. Accordingly, the coverage of a film formed over the second gate electrode 122 gets worse, and breakage of the film is easily caused. In addition, since the second gate electrode is used as a mask for forming an LDD region, it becomes difficult to control the LDD length. This etching on the side surface is a phenomenon which occurs when the etching rate of the second gate electrode 122 is higher than the etching rate of the resist. Therefore, in this embodiment mode, the etching rate of the second gate electrode 122 is lowered by setting a sample stage temperature to be as low as 0° C. or less, preferably −10° C. or less; thus, etching of the side surface can be suppressed.

Figure 6A:
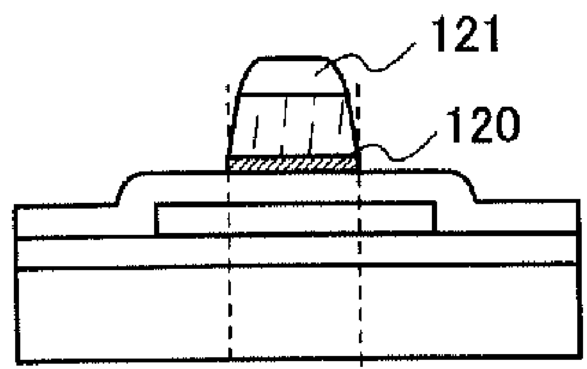
FIGS. 6A and 6B illustrate a method of manufacturing a semiconductor device according to an aspect of the present invention.
Figure 6B:
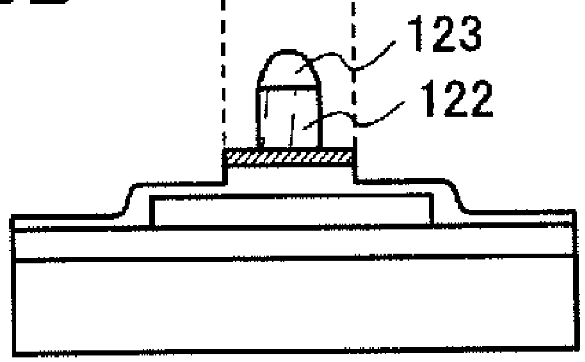

In the case in which the gate insulating film 114 is not etched in the second etching as shown in FIG. 6A, the gate insulating film 114 is etched in the third etching so that the thickness becomes small (see FIG. 6B). In other words, the thickness of the gate insulating film 114 is large under the second gate electrode 122 and is small under a region in which the second gate electrode 122 is not formed. In this embodiment mode, the thickness of the gate insulating film 114 is reduced by 10 to 15 nm after the second etching and the third etching.

Through the above steps, a shape of a hat-shaped gate electrode is obtained. A hat-shaped structure of the present invention is obtained by making the use of a width of a recess of the resist in etching. Specifically, the width of the recess in the third etching, which is a difference between widths of the third resist 121 and the fourth resist 123 equals a difference between the gate lengths of the first gate electrode 120 and that of the second gate electrode 122. Alternatively, the total width of recesses of the resist in the second etching and the third etching, in other words, width of the recess, which is a difference between widths of the second resist 119 and the fourth resist 123 equals the difference between the gate lengths of the first gate electrode 120 and that of the second gate electrode 122.

In a method of manufacturing a hat-shaped gate electrode of the present invention, the difference between the gate lengths (the Lov length) of the first gate electrode 120 and the second gate electrode 122 can be 20 to 200 nm; thus, a quite minute gate electrode structure can be formed.

The first to third etchings of this embodiment mode can be performed by dry etching, and an inductively coupled plasma (ICP) etching method can be used.

Figure 2A:
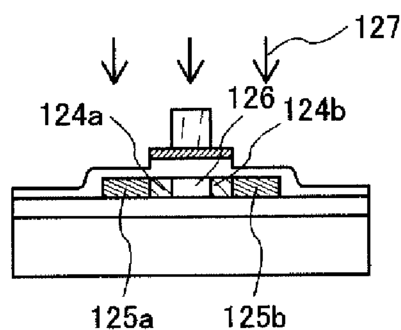
FIGS. 2A to 2H illustrate a method of manufacturing a semiconductor device according to an aspect of the present invention.

Next, an impurity element 127 is added to the island-shaped semiconductor film 113 (see FIG. 2A). The impurity element is added to the island-shaped semiconductor film 113 through the first gate electrode 120 and the gate insulating film 114 to form low-concentration impurity regions 124*a* and 124*b* in the island-shaped semiconductor film 113 overlapping with the first gate electrode 120 using the second gate electrode 122 as a mask. At the same time, the impurity element is also added to both end portions of the island-shaped semiconductor film 133 only through the gate insulating film 114 to form low-concentration impurity regions 125*a* and 125*b*. In addition, since the impurity element is not added to a region under the second gate electrode 122 with the second gate electrode 122 serving as a mask, a channel-formation region 126 is also formed.

The element concentrations in the low-concentration impurity regions 124*a*, 124*b*, 125*a*, and 125*b* are each $1\times10^{16}$ to $1\times10^{20}$ atoms/cm$^3$ (preferably, $1\times10^{16}$ to $5\times10^{18}$ atoms/cm$^3$). Ion doping or ion implantation can be used as a method of adding an impurity element. For example, boron (B), gallium (Ga), or the like is used as the impurity element in manufacturing a p-type semiconductor, whereas phosphorus (P), arsenic (As), or the like is used in manufacturing an n-type semiconductor. In this embodiment mode, phosphorus is added as an n-type impurity.

The addition of the impurity element for forming the low-concentration impurity regions 124*a* and 124*b* is conducted not only through the gate insulating film 114, but also through the first gate electrode 120. On the other hand, the addition of the impurity element for forming the low-concentration impurity regions 125*a* and 125*b* is conducted through the gate insulating film 114, which is thinned by the etching of the first gate electrode 120 or the second gate electrode 122. In addition, the addition of the impurity element is conducted under the condition in which a concentration profile as shown in Embodiment 1 described below can be obtained. Therefore, the concentration of the impurity element in the low-concentration impurity regions 125*a* and 125*b* is lower than that in the low-concentration impurity regions 124*a* and 124*b*.

Then, an insulating layer is formed to cover the gate insulating film 114, the first gate electrode 120, and the second gate electrode 122. The insulating layer is formed by forming a film of silicon oxide containing nitrogen ($SiO_xN_y$) (x>y) having a thickness of 100 nm by a plasma CVD method, and then, forming a film of silicon oxide ($SiO_2$) having a thickness of 200 nm by a thermal CVD method.

Next, the insulating layer is selectively etched by anisotropic etching mainly in a perpendicular direction to form insulating layers (hereinafter referred to as sidewalls) 128 which are in contact with side surfaces of the first gate electrode 120 and the second gate electrode 122 (see FIG. 2B). The sidewalls 128 are used as a mask to form silicide later. In addition, by this etching, the gate insulating film 114 is partially removed as well to form a gate insulating film 129 and a part of the island-shaped semiconductor film 113 which is not covered with the sidewalls 128 is exposed. In other words, a thickness of the gate insulating film 129 is large over the channel-formation region 126 and the low-concentration impurity regions 124*a* and 124*b*, which are to serve as Lov regions, whereas the thickness of the gate insulating film 129 is small in regions which are over the low-concentration impurity regions 125*a* and 125*b* and are covered with the sidewalls 128. A part of the gate insulating film 129 which is over the low-concentration impurity regions 125*a* and 125*b* and is not covered with the sidewalls 128 is removed so as to partially expose the island-shaped semiconductor film 113. These exposed regions in the island-shaped semiconductor film are to serve as source and drain regions later.

Figure 2B:
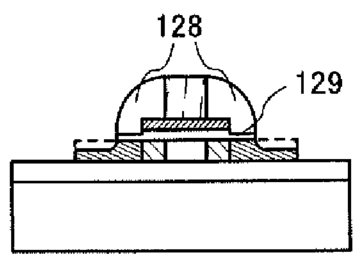
Figure 2C:
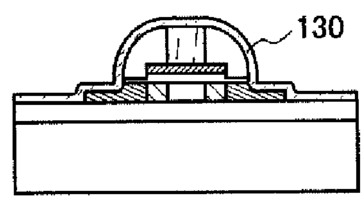

Next, after a natural oxide film formed on the surface of the exposed part of the island-shaped semiconductor film is removed, a metal film 130 is formed (see FIG. 2C). The metal film 130 is formed of a material which reacts with the island-shaped semiconductor film to form silicide. The metal film 130 can be, for example, a nickel film, a titanium film, a cobalt film, a platinum film, or a film of an alloy including at least two of these elements, or the like. In this embodiment mode, a nickel film is used as the metal film 130, and the nickel film is formed by sputtering at a room temperature with a film formation power of 500 W to 1 kW to have a film thickness of, for example, 10 nm.

Figure 2D:
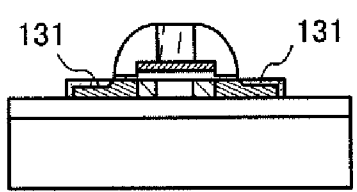
Figure 2E:
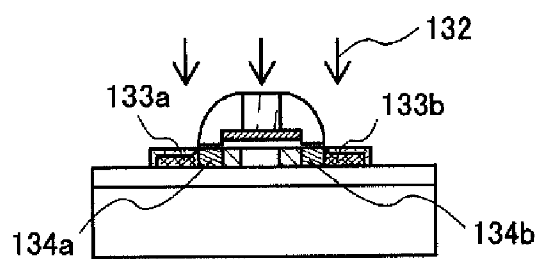

After the metal film 130 is formed, a silicide layer 131 is formed by heat treatment. The silicide layer 131 is nickel silicide in this embodiment mode. As the heat treatment, RTA, furnace annealing, or the like can be used. At this time, by adjusting a film thickness, a heating temperature, and a heating time of the metal film 130, either structure in FIG. 2D or FIG. 2G is obtained. In the structure shown in FIG. 2D, the silicide layer 131 is formed in an upper part of the island-shaped semiconductor film 113. In the structure shown in FIG. 2G, a region in the island-shaped semiconductor film 131 which is not covered with the sidewalls 128 becomes the silicide layer 131. For example, the structure in FIG. 2G can be obtained by forming a metal film so as to have a film thickness that is equal to or more than half of that of the semiconductor film, by heightening a heating temperature, or by lengthening a heating time.

Then, a part of the metal film 130 which has not reacted is removed. In this embodiment mode, nickel which has not reacted is removed by using an etching solution in which $HCl:HNO_3:H_2O$ is 3:2:1.

Then, after the silicide layer 131 is formed to have a film thickness that is equal to or less than that of the island-shaped semiconductor film 113 as shown in FIG. 2D, an impurity element 132 is added using the sidewalls 128 and the second gate electrode 122 as a mask. By this adding step, high-concentration impurity regions 133*a* and 133*b* are formed, which serve as source and drain regions. The impurity element is added to the high-concentration impurity regions 133*a* and 133*b* so that the element concentrations in the high-concentration impurity regions 133*a* and 133*b* are each $1\times10^{19}$ to $1\times10^{21}$ atoms/cm$^3$. At the same time, low-concentration impurity regions 134*a* and 134*b* are formed. Ion doping or ion implantation can be used as a method of adding an impurity element. Boron (B), gallium (Ga), or the like is used as the impurity element in manufacturing a p-type semiconductor, whereas phosphorus (P), arsenic (As), or the like is used in manufacturing an n-type semiconductor. In this embodiment mode, phosphorus is added as an n-type impurity (see FIG. 2E).

Then, an interlayer insulating film 135 is formed. The interlayer insulating film 135 is formed using an organic material or an inorganic material. The interlayer insulating film 135 may have a single layer structure or a stack-layer structure. A contact hole is formed by etching in the interlayer insulating film 135 to expose the silicide layer 131. Then, a conductive layer is formed to fill the contact hole and is etched to form a wiring 136 (see FIG. 2F).

Figure 2F:
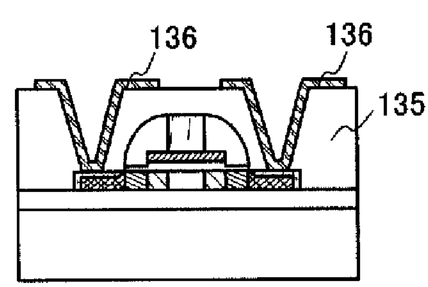
Figure 2G:
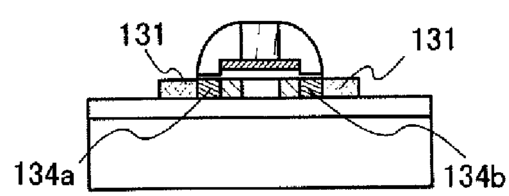
Figure 2H:
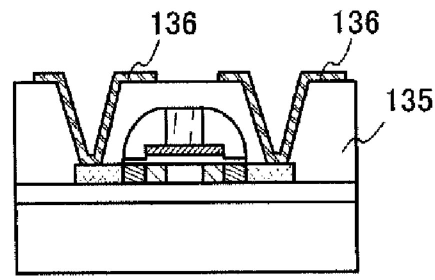

On the other hand, after an entire thickness of the island-shaped semiconductor film 113 becomes silicide as shown in FIG. 2G, the interlayer insulating film 135 is formed, and the wiring 136 is formed similarly to that in FIG. 2F, so that a structure in FIG. 2H is obtained. In FIG. 2H, source and drain regions formed by the silicide layer 131 can be formed.

Before the interlayer insulating film 135 is formed, or after a first or second layer is formed in the case of the interlayer insulating film 135 is a stack-layer, thermal activation of the impurity regions may be conducted. A method of laser light irradiation, RTA, heat treatment using a furnace or the like can be used for the thermal activation.

In one structure of this embodiment mode shown in FIG. 2F, the high-concentration impurity regions 133*a* and 133*b* are to serve as source and drain regions later. In addition, the low-concentration impurity regions 134*a* and 134*b*, which are parts of the island-shaped semiconductor film overlapping with the bottom surfaces of the sidewalls 128 formed on the side surfaces of the first gate electrode 120 with the gate insulating film 129 interposed therebetween, serve as Loff regions. Further, the low-concentration impurity regions 124*a* and 124*b*, which overlap with the first gate electrode 120 with the gate insulating film 129 interposed therebetween, serve as Lov regions.

In FIG. 2H, the silicide layers 131 serve source and drain regions. In addition, similarly to FIG. 2F, the low-concentration impurity regions 134*a* and 134*b* serve as Loff regions, and the low-concentration impurity regions 124*a* and 124*b* serve as Lov regions.

When the structure in FIG. 2F is compared with the structure in FIG. 2H, an area in which the silicide layer 131 is in contact with a part of the island-shaped semiconductor film which is not silicided in FIG. 2F is larger than in FIG. 2H. Therefore, in FIG. 2F, contact resistance between the silicide layer 131 and the part of the island-shaped semiconductor film other than the silicide layer 131 becomes low, and parasitic resistance is lower than that of the structure in FIG. 2H.

On the other hand, when the structure in FIG. 2H is compared with the structure in FIG. 2F, resistance of the source region and the drain region in FIG. 2H is lower than in FIG. 2F. In addition, since a step of doping with the impurity element 132 for forming the high-concentration impurity region is not required, the number of steps can be reduced by one.

In FIGS. 2C to 2F, the impurity element 132 for forming the high-concentration impurity region is added after forming the silicide layer 131; however, the metal film 130 and the silicide layer 131 may be formed after adding the impurity element 132. Further, in order to obtain the structure in FIG. 2H, the silicide layer 131 may be formed after adding the impurity element 132 using the sidewalls 128 and the second gate electrode 122 as a mask.

As described above, in this embodiment mode, impurity concentration in the Loff region can be controlled by adding the impurity element through a part of the gate insulating film with a reduced thickness. Thus, in the semiconductor device in this embodiment mode, off current can be reduced and hot carrier deterioration can be prevented; accordingly, the reliability is improved.

Embodiment Mode 2

In this embodiment mode, a method of manufacturing a semiconductor device in which only an Loff region is provided is described with reference to FIGS. 3A to 3D. In addition, in this embodiment mode, the same reference numerals are used for the same portions as in Embodiment Mode 1 and a detailed explanation of the portions is omitted.

Figure 3A:
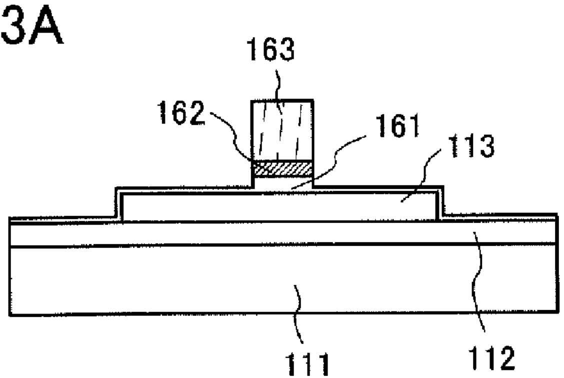
FIGS. 3A to 3D illustrate a method of manufacturing a semiconductor device according to an aspect of the present invention.
Figure 3B:
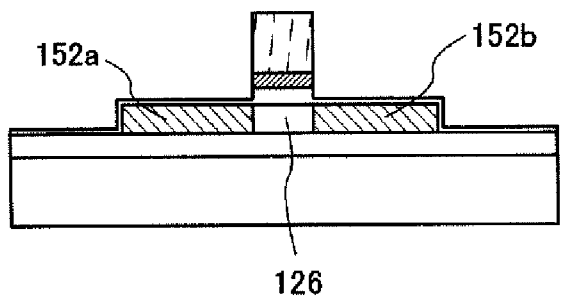

Steps up to the second etching is conducted similarly to those in Embodiment Mode 1 and a structure in FIG. 1C is obtained (see FIG. 3A). Note that in FIG. 3A, the base insulating film 112, the island-shaped semiconductor film 113, a gate insulating film 161, a first gate electrode 162, and a second gate electrode 163 are formed over the substrate 111. In this embodiment mode, the widths of the first gate electrode 162 and the second gate electrode 163 are the same. In addition, the second gate electrode 163 may have, but is not required to have, a taper angle.

The gate insulating film 161 is formed so that a thickness thereof is smaller in a region not under the first gate electrode 162 and the second gate electrode 163 than under the first gate electrode 162 and the second gate electrode 163. As described in Embodiment Mode 1, in conducting the second etching, the gate insulating film 161 is overetched, so that the gate insulating film 161 can be thin under a region other than the first gate electrode 162 and the second gate electrode 163. In other words, a thickness of the gate insulating film 161 is large over the channel-formation region 126, which is formed in a later step and the thickness of the gate insulating film 161 is small over low-concentration impurity regions 166*a* and 166*b*, which are to serve as Loff regions, and over high-concentration impurity regions 167*a* and 167*b*, which are to serve as source and drain regions.

Next, an impurity element is added through the gate insulating film 161, similarly to a step shown in FIG. 2A. Thus, low-concentration impurity regions 152*a* and 152*b*, and the channel-formation region 126 are formed (see FIG. 3B). At this time, the impurity element is easily controlled because the gate insulating film 161 is thin over parts of the island-shaped semiconductor film which are to serve as the low-concentration impurity regions 152*a* and 152*b*.

Then, the sidewalls 128 are formed. Etching is conducted with using the sidewalls 128, the second gate electrode 163, and the first gate electrode 162 as a mask in order to remove the gate insulating film 161 except parts of the gate insulating film 161 which are under the sidewalls 128, the second gate electrode 163, and the first gate electrode 162. Thus, a gate insulating film 165 is formed. Accordingly the island-shaped semiconductor film 113 is partially exposed. These exposed regions in the island-shaped semiconductor film are to serve as the source and drain regions later.

Then, similarly to a step shown in FIG. 2E, an impurity element is added to the exposed regions in the island-shaped semiconductor film 113 so as to form the high-concentration impurity regions 167*a* and 167*b*, which are to serve as the source and drain regions. Since the impurity element is not added to regions in the low-concentration impurity regions 152*a* and 152*b* which are covered with the sidewalls 128 in this step, the low-concentration impurity regions 166*a* and 166*b*, which are the Loff regions are formed (see FIG. 3C).

Then, the interlayer insulating film 135 is formed and contact holes which reach the high-concentration impurity regions 167*a* and 167*b* are formed in the interlayer insulating film 135. A conductive film is formed over the interlayer insulating film 135 and then, is etched so as to make the wirings 136 which are to serve as a source electrode and drain electrode (see FIG. 3D).

An Lov region and a silicide layer are not formed in this embodiment mode, which is different from Embodiment Mode 1. However, impurity concentration in the Loff region can be controlled by adding an impurity through a part of the gate insulating film of which a thickness is smaller than the other part. Therefore, a semiconductor device obtained in this embodiment mode can have reduced off current.

Embodiment Mode 3

In this embodiment mode a method of manufacturing a semiconductor device in which only an Loff region is provided, which is different from that in Embodiment Mode 2, is described with reference to FIGS. 4A to 4C and 5A to 5D. In addition, in this embodiment mode, the same reference numerals are used for the same portions as in Embodiment Modes 1 and 2, and a detailed explanation of the portions is omitted.

Figure 3C:
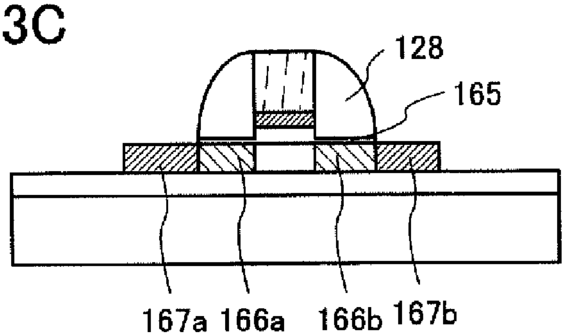
Figure 3D:
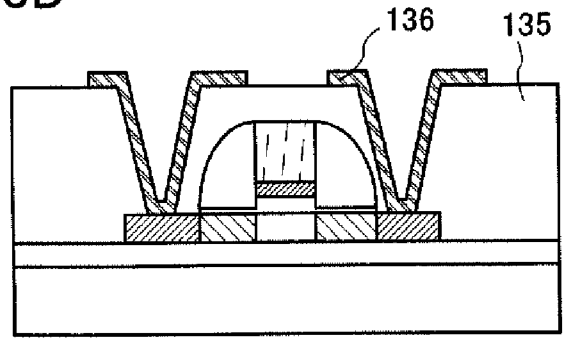
Figure 4A:
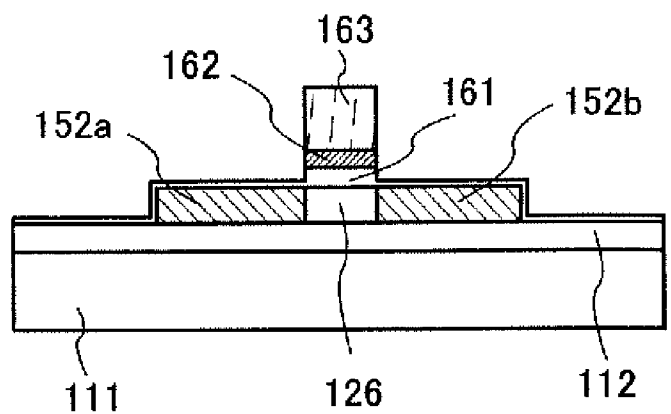
FIGS. 4A to 4C illustrate a method of manufacturing a semiconductor device according to an aspect of the present invention.
Figure 4B:
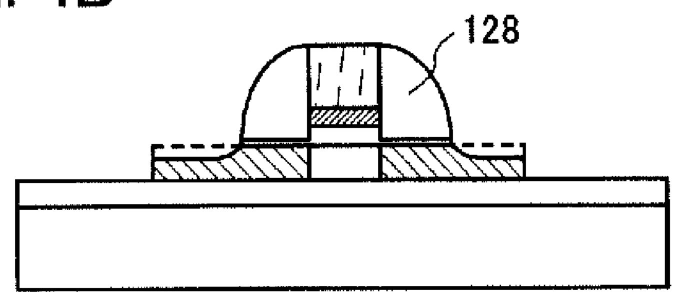

A structure in FIG. 3C is obtained similarly to Embodiment Mode 2 (see FIG. 4A). That is, the base insulating film 112, the island-shaped semiconductor film 113, the gate insulating film 161, the first gate electrode 162, and the second gate electrode 163 are formed over the substrate 111. The island-shaped semiconductor film 113 includes the channel-formation region 126 and the low-concentration impurity regions 152*a* and 152*b*.

The gate insulating film 161 is formed so that the thickness thereof is smaller in a region not under the first gate electrode 162 and the second gate electrode 163 than under the first gate electrode 162 and the second gate electrode 163. As described in Embodiment Mode 1, in conducting the second etching, the gate insulating film 161 is overetched, so that the gate insulating film 161 can be thin in a region not under the first gate electrode 162 and the second gate electrode 163.

Then, the sidewalls 128 are formed as those in FIG. 2B. In the formation of the sidewalls 128, the gate insulating film 161 is partially removed as well to partially expose the island-shaped semiconductor film 113. These exposed regions in the island-shaped semiconductor film are to serve as source and drain regions later (see FIG. 4B).

Figure 4C:
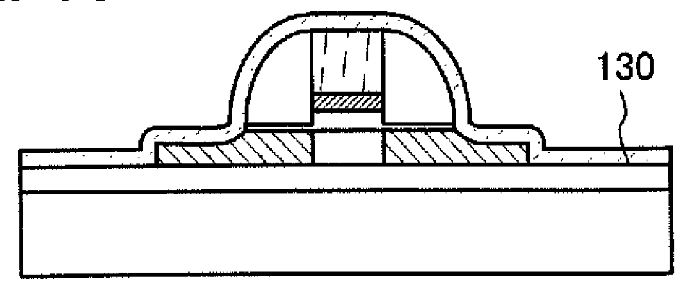

Then, as in FIG. 2C, the metal film 130 is formed to cover the exposed regions in the island-shaped semiconductor film, the sidewalls 128, and the second gate electrode 163 (see FIG. 4C).

Figure 5A:
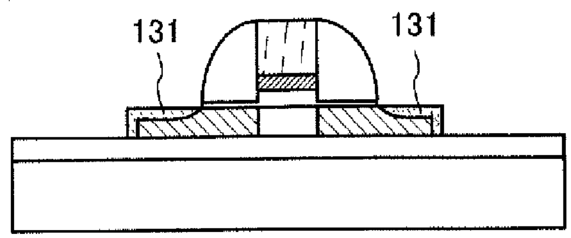
FIGS. 5A to 5D illustrate a method of manufacturing a semiconductor device according to an aspect of the present invention.

After the metal film 130 is formed, the silicide layer 131 is formed by heat treatment (see FIG. 5A). Further, a part of the metal film 130 which is not reacted is removed.

Figure 5B:
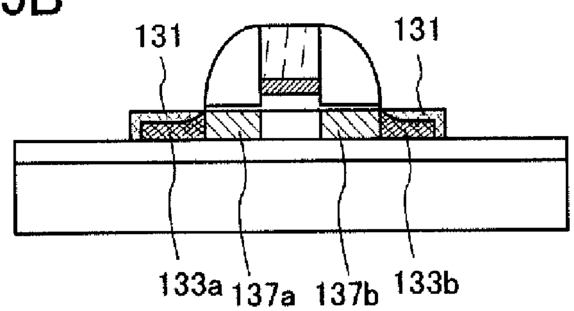

Then, similarly to a step shown in FIG. 2E, an impurity element is added so as to form low-concentration impurity regions 137*a* and 137*b*, which are Loff regions, and the high-concentration impurity regions 133*a* and 133*b*, which are source and drain regions (see FIG. 5B).

Figure 5C:
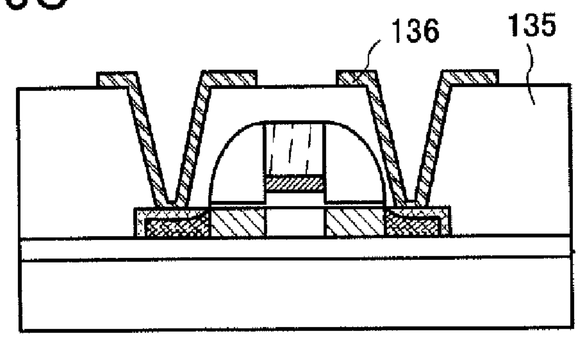
Figure 5D:
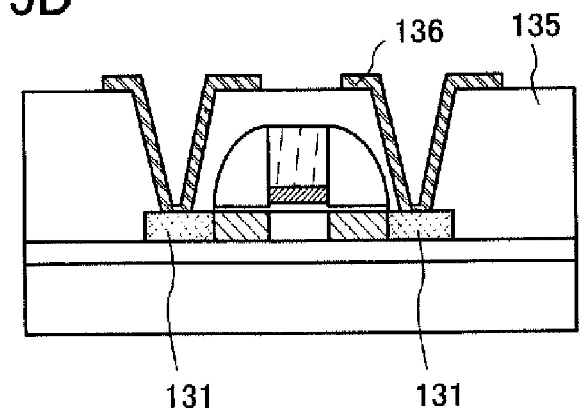

Then, the interlayer insulating film 135 and the wirings 136 which are electrically connected to the high-concentration impurity regions 133*a* and 133*b* are formed (see FIG. 5C). Note that, as in FIG. 2H, when the an entire thickness of the island-shaped semiconductor film 113 becomes silicide, a structure in FIG. 5D is obtained.

Note that in this embodiment mode, the impurity element for forming the high-concentration impurity regions 133*a* and 133*b* is added after forming the silicide layer 131; however, the silicide layer 131 may be formed after adding the impurity element for forming the high-concentration impurity regions 133*a* and 133*b*. In this case, an impurity element is added using the sidewalls 128 and the second gate electrode 163 as a mask. Then, the metal film 130 may be formed and is subjected to the heat treatment to form the silicide layer 131.

As described above, in this embodiment mode, impurity concentration in the Loff region can be controlled by adding an impurity element through a part of the gate insulating film of which a thickness is smaller than that of the other part. Therefore, a semiconductor device obtained in this embodiment mode can have reduced off current.

Embodiment Mode 4

In this embodiment mode, an example in which a central processing unit (CPU) is manufactured according to the present invention is described with reference to FIGS. 7A, 7B, 8, 9, and 10A to 10C. In this embodiment mode, the same reference numerals are used for the same portions as in Embodiment Modes 1 to 3, and a detailed explanation of the portions is omitted.

First, based on Embodiment Modes 1 to 3, a CMOS circuit 183 which includes an n-channel TFT 181 and a p-channel TFT 182 is formed over the substrate 111 and the base insulating film 112. In this embodiment mode, a TFT having a similar structure as that in Embodiment Mode 1 is formed.

The n-channel TFT 181 has a structure shown in FIG. 2F, which includes the channel-formation region 126; the low-concentration impurity regions 124*a* and 124*b*, which are Lov regions; the low-concentration impurity regions 134*a* and 134*b*, which are Loff regions; the high-concentration impurity regions 133*a* and 133*b*, which are source and drain region; the gate insulating film 129; the first gate electrode 120; the second gate electrode 122; and the sidewalls 128.

The thickness of the gate insulating film 129 is smaller over the Loff region than over the Lov region. An impurity element imparting an n-type conductivity, such as phosphorus (P) is added to the low-concentration impurity regions 124*a*, 124*b*, 134*a*, and 134*b*, and the high-concentration impurity regions 133*a* and 133*b*.

The p-channel TFT 182 has a structure similar to that of the n-channel TFT 181, but an impurity element added thereto is a p-type impurity element. The p-channel TFT 182 includes a channel-formation region 156; low-concentration impurity regions 154*a* and 154*b*, which are Lov regions; low-concentration impurity regions 164*a* and 164*b*, which are Loff regions; high-concentration impurity regions 163*a* and 163*b*, which are source and drain regions; a gate insulating film 159; a first gate electrode 150; a second gate electrode 160; and sidewalls 158.

A thickness of the gate insulating film 159 is smaller over the Loff region than over the Lov region, similar to the gate insulating film 129. An impurity element imparting a p-type conductivity, such as boron (B) is added to the low-concentration impurity regions 154*a*, 154*b*, 164*a*, and 164*b*, and the high-concentration impurity regions 163*a* and 163*b*.

Then, the interlayer insulating film 135 is formed to cover the n-channel TFT 181 and the p-channel TFT 182. Contact holes which reach the high-concentration impurity regions 133*a*, 133*b*, 163*a*, and 163*b* are formed in the interlayer insulating film 135. Further, a conductive film is formed over the interlayer insulating film 135 to form the wirings 136 (electrodes or wirings 136*a*, 136*b*, and 136*c*) (see FIG. 7A).

The electrode or wiring 136*a* is electrically connected to the high-concentration impurity region 133*a*, and the electrode or wiring 136*c* is electrically connected to the high-concentration impurity region 163*b*. In addition, the electrode or wiring 136*b* is electrically connected to the high-concentration impurity region 133*b* and 163*a*.

Then, an interlayer insulating film 171 is formed to cover the electrodes or wirings 136*a* to 136*c* and the interlayer insulating film 135. The interlayer insulating film 171 is formed to be a single layer or a stack-layer of an inorganic material or an organic material. The interlayer insulating film 171 is formed to relieve unevenness caused by thin film transistors, for planarization. Therefore, the interlayer insulating film 171 is preferably formed of an organic material.

Then, the interlayer insulating film 171 is etched using a photolithography method and contact holes are formed to expose the electrodes or wirings 136*a* and 136*c*. Next, a conductive layer is formed to fill the contact holes. The conductive layer is etched using a photolithography technique, so that conductive layers 173 and 174 which are to serve as wirings or the like are formed. The conductive layers 173 and 174 are formed to be a single layer or stack-layer of an element selected from aluminum (Al), titanium (Ti), silver (Ag), and copper (Cu), or an alloy material or a compound material containing any of those elements as its main component. For example, a stack-layer structure including a barrier layer and an aluminum layer, a stack-layer structure including a barrier layer, an aluminum layer, and a barrier layer, or the like may be employed. The barrier layer corresponds to a layer of titanium, titanium nitride, molybdenum, or molybdenum nitride.

The conductive layer 173 is electrically connected to the electrode or wiring 136*a*, and the conductive layer 174 is electrically connected to the electrode or wiring 136*c*.

Figure 7A:
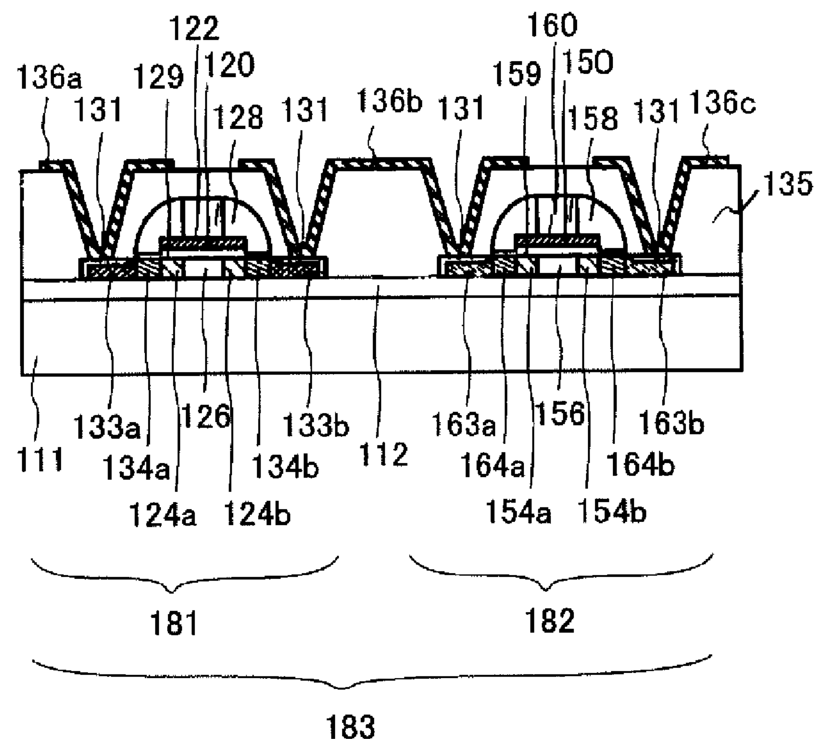
FIGS. 7A and 7B illustrate a method of manufacturing a semiconductor device according to an aspect of the present invention.
Figure 7B:
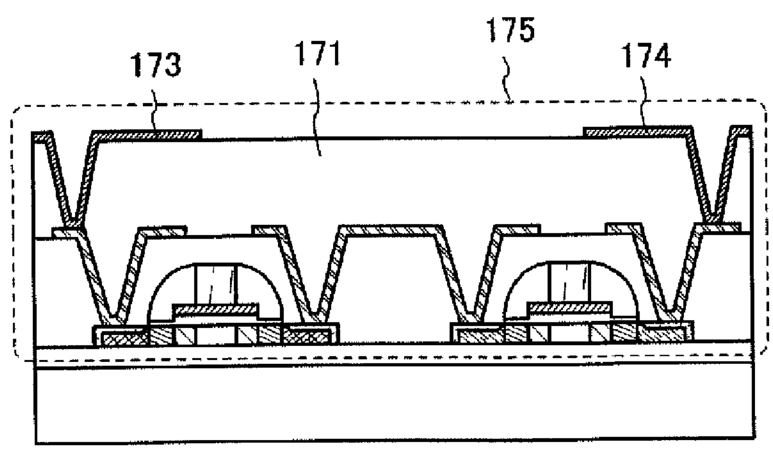

Although only one n-channel TFT 181 and one p-channel TFT 182 are shown over the substrate 111 in FIGS. 7A and 7B, a plurality of n-channel TFTs 181 and a plurality of p-channel TFTs 182 are formed in practice. An element group including the plurality of n-channel TFTs 181 and the plurality of p-channel TFTs 182, and a plurality of conductive layers 173 and 174, which serve as wirings or the like, are collectively referred to as a thin film integrated circuit 175. Note that a protective layer may be formed by a known means to cover the thin film integrated circuit 175, although not shown in this process. The protective layer corresponds to a layer containing carbon such as DLC (diamond like carbon), a layer containing silicon nitride, or a layer containing silicon nitride oxide.

A plurality of thin film integrated circuits 175, which are formed as described above, are formed over one substrate; thus, a CPU can be manufactured.

When the manufactured CPU should be flexible or light weight, the substrate 111 may be separated from the CPU by a known method and the CPU may be attached to another substrate which is light weight and flexible.

Further, a specific configuration of the CPU of this embodiment mode is described with reference to a block diagram.

Figure 8:
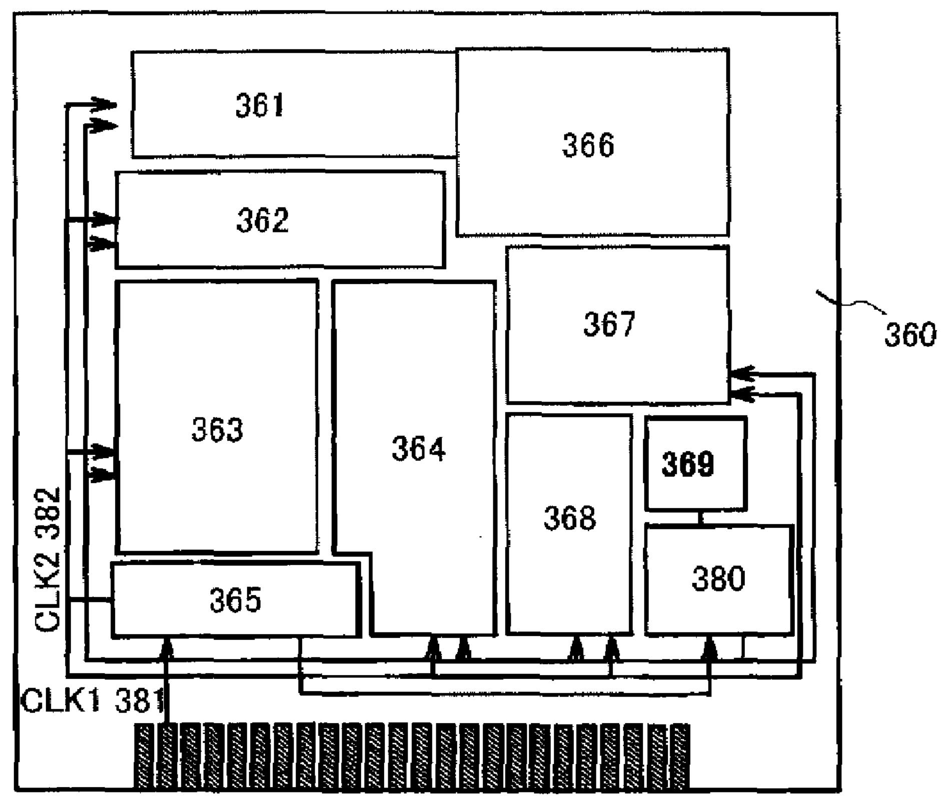
FIG. 8 is a block diagram of a CPU manufactured according to an aspect of the present invention.

A CPU shown in FIG. 8 mainly includes an arithmetic logic unit (ALU) 361, an ALU controller 362, an instruction decoder 363, an interrupt controller 364, a timing controller 365, a register 366, a register controller 367, a bus interface (Bus I/F) 368, a rewritable ROM 369, and a ROM interface (ROM I/F) 380, over a substrate 360. The ROM 369 and the ROM interface 380 may alternatively be provided over another chip. These various circuits forming the CPU are formed by a plurality of thin film integrated circuits 175.

Obviously, the CPU shown in FIG. 8 is just an example in which a configuration is simplified, and an actual CPU may have various configurations depending on the application.

An instruction inputted to the CPU via the bus interface 368 is inputted to the instruction decoder 363 and decoded therein, and then, inputted to the ALU controller 362, the interrupt controller 364, the register controller 367, and the timing controller 365.

The ALU controller 362, the interrupt controller 364, the register controller 367, and the timing controller 365 conduct respective controls based on the decoded instruction. Specifically, the ALU controller 362 generates signals to control operation of the ALU 361. While the CPU is executing a program, the interrupt controller 364 determines an interrupt request from an external input/output device or a peripheral circuit based on its priority or a mask state, and processes the request. The register controller 367 generates an address of the register 366, and reads/writes data from/to the register 366 in accordance with the state of the CPU.

The timing controller 365 generates signals to control a drive timing of the ALU 361, the ALU controller 362, the instruction decoder 363, the interrupt controller 364, and the register controller 367. For example, the timing controller 365 is provided with an internal clock generator for generating an internal clock signal CLK2 (382) based on a reference clock signal CLK1 (381), and supplies the internal clock signal CLK2 to the above-described circuits.

Figure 9:
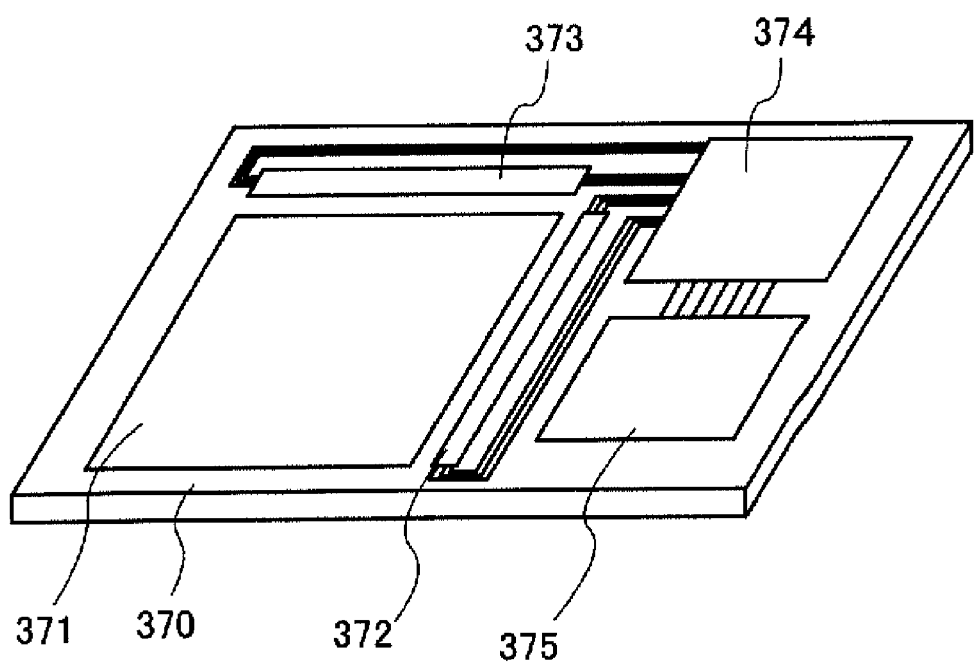
FIG. 9 is a circuit diagram of a CPU manufactured according to an aspect of the present invention.

FIG. 9 shows a display device, a so-called system-on-panel in which a pixel portion, a CPU, and another circuit are formed over one substrate. Over a substrate 370, a pixel portion 371, a scan line driver circuit 372 for selecting a pixel included in the pixel portion 371, and a signal line driver circuit 373 for supplying a video signal to a selected pixel are provided. A CPU 374 is connected to the other circuit, for example, a control circuit 375 by wirings which are led from the scan line driver circuit 372 and the signal line driver circuit 373. Note that the control circuit includes an interface. A connecting portion with an FPC terminal is provided at an end portion of the substrate so as to transmit/receive signals to/from external circuits.

Another circuit, such as a video signal processing circuit, a power source circuit, a gray scale power source circuit, a video RAM, a memory (DRAM, SRAM, PROM) or the like can be provided over the substrate. Alternatively, these circuits may be formed of an IC chip and mounted over the substrate. Further, the scan line driver circuit 372 and the signal line driver circuit 373 are not necessarily formed over the same substrate. For example, only the scan line driver circuit 372 may be formed over the same substrate as the pixel portion, while the signal line driver circuit 373 may be formed using an IC chip and mounted.

Figure 10A:
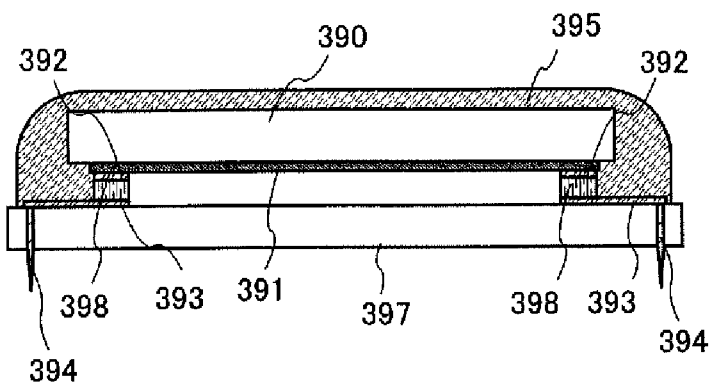
FIGS. 10A to 10C each illustrate a mode of packaging of a CPU manufactured according to an aspect of the present invention.
Figure 10B:
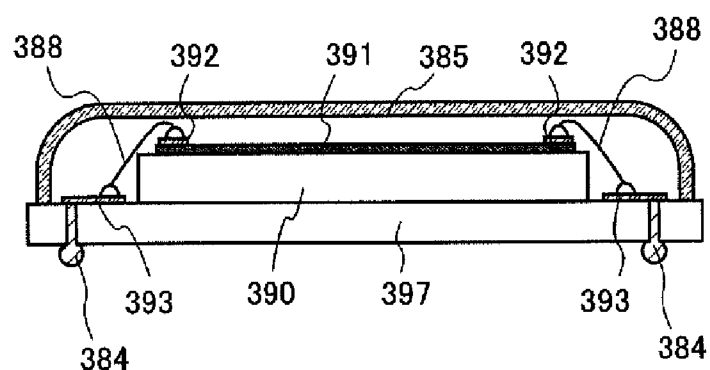
Figure 10C:
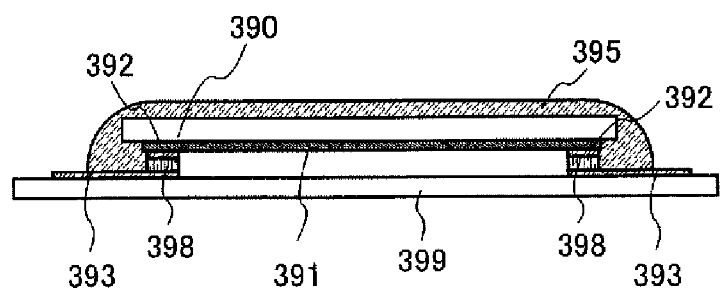

FIGS. 10A to 10C each show a mode of a packaged CPU. A substrate 390 in FIGS. 10A to 10C corresponds to the substrate 111 shown in FIGS. 1A to 7B. A plurality of the thin film integrated circuits 175 are provided over a thin film transistor array 391.

In FIG. 10A, the CPU is packaged in a face-down position such that thin film transistor array 391 having a function of a CPU which is formed over a substrate 390 and electrodes 392 (a source electrode and a drain electrode, or an electrode formed thereover with an insulating film interposed therebetween) provided over a surface of the CPU are on a lower side. In addition, a wiring board provided with wiring 393 which is formed of copper or an alloy thereof, for example, a printed board 397 is provided. The printed board 397 is provided with a connection terminal (a pin) 394. The electrode 392 and the wiring 393 are connected to each other with an anisotropic conductive film 398 or the like interposed therebetween. Then, the CPU is covered with a resin 395 such as an epoxy resin from an upper side of the substrate 390. Thus, the packaged CPU is completed. Alternatively, a periphery of the CPU may be surrounded with plastic or the like while keeping a hollow space, instead of covering the CPU with a resin.

In FIG. 10B, a CPU is packaged in a face-up position such that the electrodes 392 formed over a surface of the CPU are on the upper side, which is different from FIG. 10A. The substrate 390 is fixed to the printed board 397, and the electrode 392 and the wiring 393 are connected to each other with a wire 388. Such connection with a wire is called wire bonding. The electrode 392 and a bump 384 which are connected to the wiring 393 are electrically connected to each other. Then, the CPU is surrounded with a plastic 385 or the like while keeping a hollow space. Thus, the packaged CPU is completed.

FIG. 10C shows an example in which the thin film transistor array 391 having a function of a CPU is fixed to a substrate having flexibility, for example, a flexible printed circuit (FPC) 399. The CPU is packaged in a face-down position such that thin film transistor array 391 having a function of a CPU which is formed over the substrate 390 and the electrodes 392 which are provided over a surface of the CPU are on a lower side. Since the thin film transistor array 391 is fixed to the FPC 399 having flexibility, a highly-flexible plastic is preferably used as the substrate 390 so that the strength of the CPU itself is increased. In addition, the FPC 399 having flexibility is provided with the wiring 393 formed of copper or an alloy thereof. Then, the electrode 392 and the wiring 393 are connected to each other with the anisotropic conductive film 398 interposed therebetween. Next, the resin 395 such as an epoxy resin is formed so as to cover the substrate 390. Thus the packaged CPU is completed.

Such packaged CPUs are protected from the exterior and it is easier to carry around. Also, the CPU can be mounted to a favorable place. When the CPU has flexibility as in FIG. 10C in particular, the degree of freedom in a position where it is mounted increases as well as the strength of the CPU itself is increased. Further, by packaging the CPU, a function of the CPU can be assisted.

In the above manner, a semiconductor device such as a CPU can be manufactured using a TFT of the present invention. Since a CPU formed using a thin film transistor formed according to the present invention is lightweight and small, burden when carrying around or mounting can be reduced.

Note that as necessary, this embodiment mode can be combined with any of the embodiment modes and embodiment.

Embodiment Mode 5

This embodiment mode describes an example of manufacturing a semiconductor device which uses an IC including a TFT of the present invention and which is capable of wireless communication, with reference to FIGS. 11 to 14, and 15A to 15C.

Figure 11:
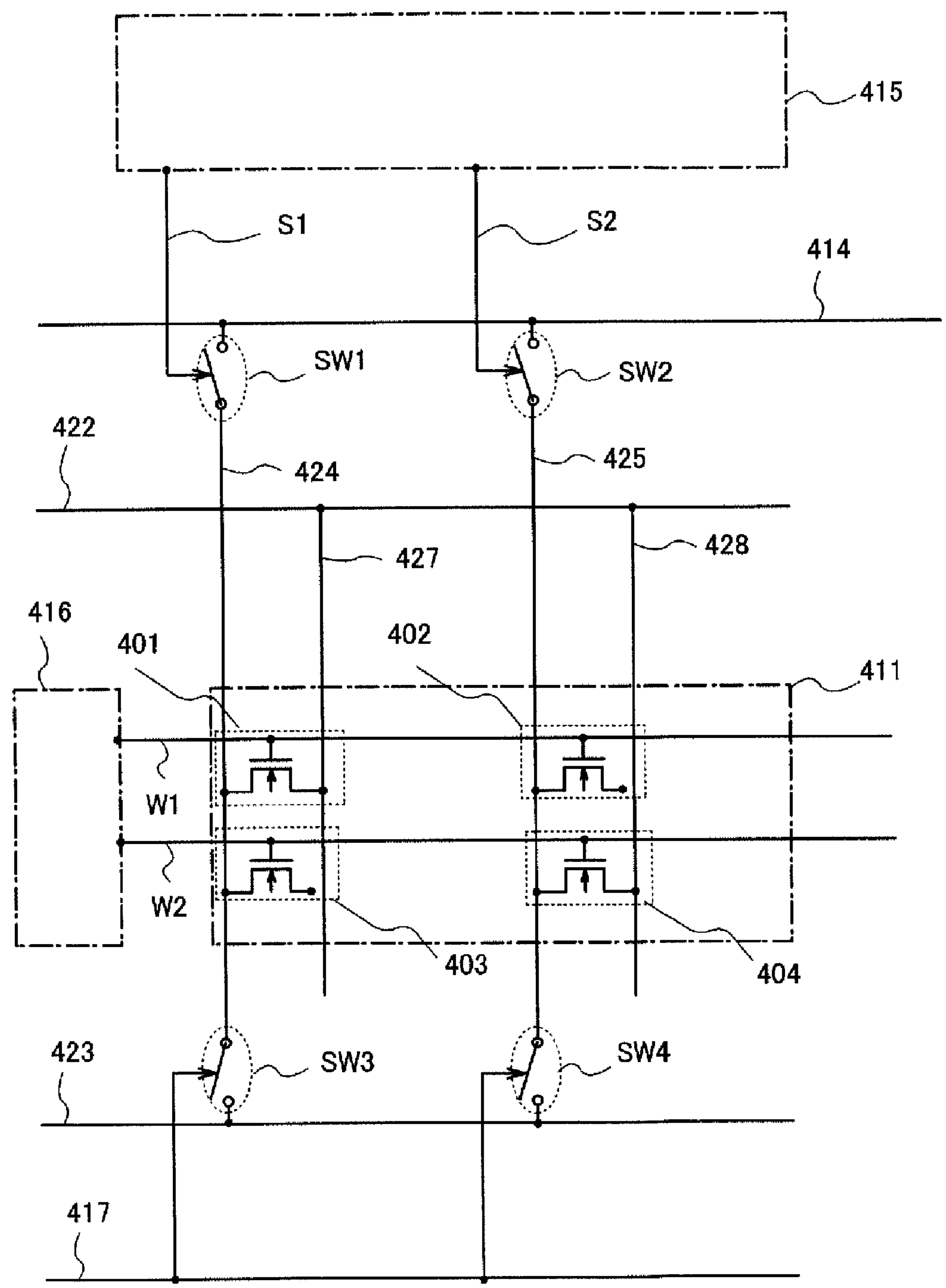
FIG. 11 is a circuit diagram of a semiconductor device using an IC manufactured according to an aspect of the present invention which is capable of wireless communication.

FIG. 11 is a circuit diagram of a mask ROM and includes a column decoder 415, a row decoder 416, a memory cell array 411 including n-channel TFTs 401 to 404, bit lines (data lines) 424 and 425, word lines W1 and W2, a high voltage power supply (VDD) 422, a low voltage power supply (VSS or GND) 423, column switches SW1 to SW4, address lines S1 and S2 which are controlled by the column decoder 415, an output line 414, a control line 417, and wirings 427 and 428 which are electrically connected to the high voltage power supply 422.

As the n-channel TFTs 401 to 404 of the memory cell array 411, TFTs obtained in Embodiment Modes 1 to 3 can be used.

Figure 15A:
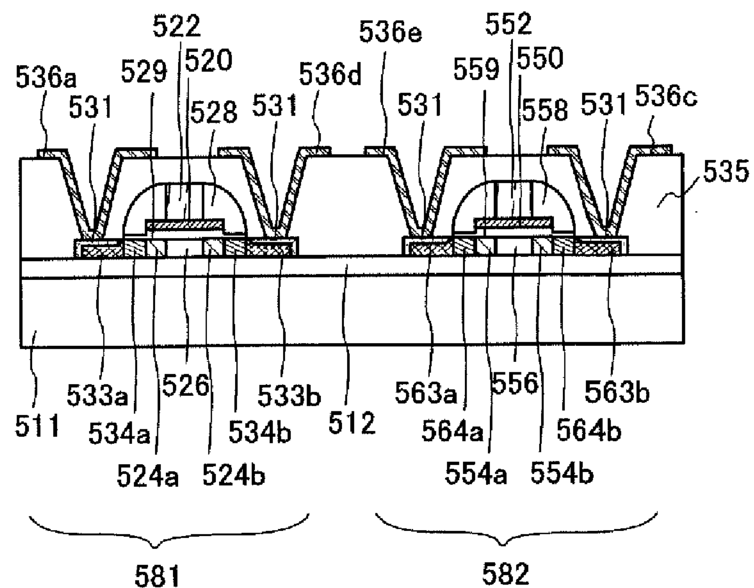
FIGS. 15A to 15C illustrate a method of manufacturing a semiconductor device according to an aspect of the present invention.
Figure 15B:
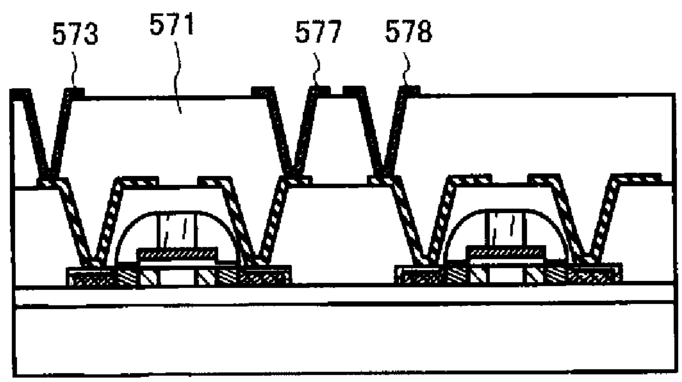
Figure 15C:
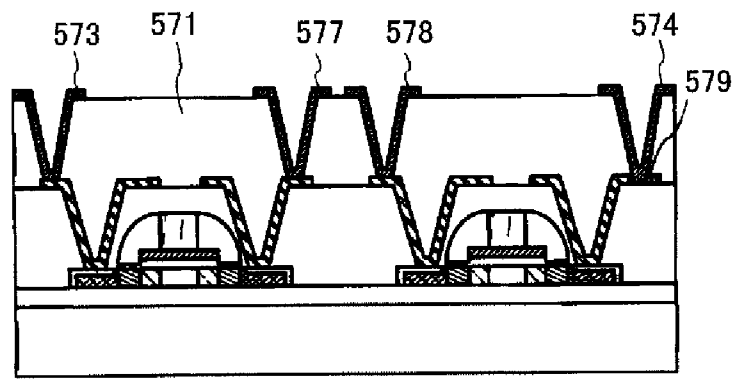

FIGS. 15A to 15C illustrate an example in which the TFT described in Embodiment Mode 1 is used as each of the n-channel TFTs 401 to 404.

TFTs 581 and 582 have the same structure as the TFT 181 in FIG. 7A. The TFTs 581 and 582 are formed over a base insulating film 512 over a substrate 511.

The TFT 581 has a channel-formation region 526; low-concentration impurity regions 524*a* and 524*b*, which are Lov regions; low-concentration impurity regions 534*a* and 534*b*, which are Loff regions; high-concentration impurity regions 533*a* and 533*b*, which are source and drain regions; silicide regions 531; a gate insulating film 529; a first gate electrode 520; a second gate electrode 522; and sidewalls 528.

A thickness of the gate insulating film 529 is smaller over the Loff region than over the Lov region. An impurity element imparting an n-type conductivity, such as phosphorus (P) is added to the low-concentration impurity regions 524*a*, 524*b*, 534*a*, and 534*b*, and the high-concentration impurity regions 533*a* and 533*b*.

The TFT 582 includes a channel-formation region 556; low-concentration impurity regions 554*a* and 554*b*, which are Lov regions; low-concentration impurity regions 564*a* and 564*b*, which are Loff regions; high-concentration impurity regions 563*a* and 563*b*, which are the source and drain regions; silicide regions 531; a gate insulating film 559; a first gate electrode 550; a second gate electrode 552; and sidewalls 558.

A thickness of the gate insulating film 559 is smaller over the Loff region than over the Lov region, similar to the gate insulating film 529. An impurity element imparting an n-type conductivity, such as phosphorus (P) is added to the low-concentration impurity regions 554*a*, 554*b*, 564*a*, and 564*b*, and the high-concentration impurity regions 563*a* and 563*b*.

Then, the interlayer insulating film 535 is formed to cover the TFT 581 and the TFT 582. Contact holes which reach the high-concentration impurity regions 533*a*, 533*b*, 563*a*, and 563*b* are formed in the interlayer insulating film 535. Further, a conductive film is formed over the interlayer insulating film 535 and electrodes or wirings 536*a*, 536*c*, 536*d*, and 536*e* are formed (see FIG. 15A).

The electrode or wiring 536*a* is electrically connected to the high-concentration impurity region 533*a*, and the electrode or wiring 536*d* is electrically connected to the high-concentration impurity region 533*b*. In addition, the electrode or wiring 536*e* is electrically connected to the high-concentration impurity region 563*a*, and the electrode or wiring 536*c* is electrically connected to the high-concentration impurity region 563*b*.

Then, an interlayer insulating film 571 is formed to cover the electrodes or wirings 536*a*, 536*c*, 536*d*, and 536*e* and the interlayer insulating film 535. The interlayer insulating film 571 is formed using an inorganic material or an organic material with a single layer or a stack-layer. The interlayer insulating film 571 is formed to relieve unevenness caused by thin film transistors for planarization. Therefore, the interlayer insulating film 571 is preferably formed of an organic material.

Then, the interlayer insulating film 571 is etched by a photolithography method and contact holes are formed to expose the electrode or wirings 536*a*, 536*d* and 536*e*. Note that a contact hole which reaches the electrodes or wiring 536*c* is not formed.

Next, a conductive layer is formed to fill the contact holes. The conductive layer is etched using a photolithography technique, so that conductive layers 573, 577, and 578 to serve as wirings or the like are formed. The conductive layers 573, 577, and 578 are formed with a single layer or a stack layer of an element selected from aluminum (Al), titanium (Ti), silver (Ag), and copper (Cu), or an alloy material or a compound material containing any of those elements as its main component. For example, a stack-layer structure including a barrier layer and an aluminum layer, a stack-layer structure including a barrier layer, an aluminum layer, and a barrier layer, or the like may be employed. The barrier layer corresponds to a layer of titanium, titanium nitride, molybdenum, or molybdenum nitride.

The conductive layer 573 is electrically connected to the electrode or wiring 536*a*, the conductive layer 577 is electrically connected to the electrode or wiring 536*d*, and the conductive layer 578 is electrically connected to the electrode or wiring 536*e*. Note that a conductive layer to be electrically connected to the electrode or the wiring 536*c* is not formed (see FIG. 15B).

Alternatively, the electrode or wiring 536*c* is partially removed to form a space 579. After forming the interlayer insulating film 571, a conductive layer 574 is formed in the same way as the conductive layers 573, 577, and 578. In this case, the conductive layer 574 may reach a region of the space 579 so as not to be electrically connected to the electrode or wiring 536*c* (see FIG. 15C).

In FIG. 11, the TFT 401 electrically connected to the wiring 427 and the TFT 404 electrically connected to the wiring 428 can employ the structure of the TFT 581. In addition, the TFTs 402 and 403 which are not electrically connected to the wirings 427 and 428 can employ the structure of the TFT 582.

Note that FIG. 11 illustrates a memory cell array for 4 bits for simplification, but needless to say, the nonvolatile memory circuit of the present invention is not limited to the one for 4 bits.

Figure 12:
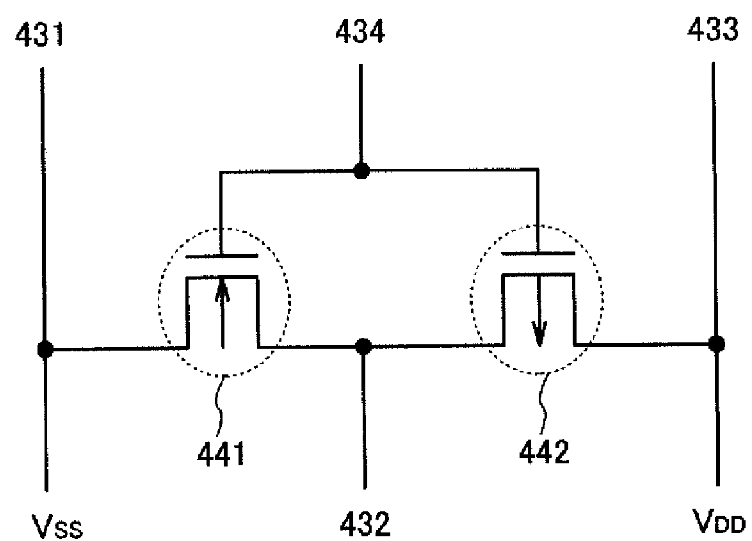
FIG. 12 is a circuit diagram of a semiconductor device using an IC manufactured according to an aspect of the present invention which is capable of wireless communication.

FIG. 12 is a circuit diagram of a logic circuit to control a mask ROM. The basic configuration of the logic circuit is a CMOS circuit in which an n-channel TFT and a p-channel TFT are connected complementarily. A column decoder and a row decoder to be described later are formed using such a CMOS circuit. FIG. 12 illustrates an inverter using a CMOS circuit.

As an n-channel TFT 441 and a p-channel TFT 442 in FIG. 12, TFTs obtained in Embodiment Modes 1 to 3 can be used. For example, the n-channel TFT 441 and the p-channel TFT 442 may be formed in the same way as the n-channel TFT 181 in FIG. 7A and the p-channel TFT 182 in FIG. 7B, respectively.

A gate electrode of the n-channel TFT 441 and a gate electrode of the p-channel TFT 442 are electrically connected to each other by a wiring 434, and the wiring 434 is an input terminal of the inverter.

One of source and drain regions of the n-channel TFT 441 and one of source and drain regions of the p-channel TFT 442 are electrically connected to each other by a wiring 432, and the wiring 432 serves as an output terminal of the inverter.

Further, the other of the source and drain regions of the n-channel TFT 441 is electrically connected to the power supply line 431, and the other of the source and drain regions of the p-channel TFTs 442 is electrically connected to the power supply line 433.

The operation of the mask ROM using the present invention described above is described with reference to FIG. 11. Note that the circuit configuration and the operation are not limited to the following descriptions as long as it is a circuit capable of reading individual data such as an ID number that is stored in or written to a memory cell. Further, for simplification, FIG. 11 illustrates operation of a memory cell for 2 bits, taking a 4-bit mask ROM as an example. However, the bit number and operation of the mask ROM are not limited to this description, the present invention is applicable in the case of a larger number of bits, and data of a memory cell for all the bits is read out.

As shown in FIG. 11, the mask ROM using the present invention includes the column decoder 415, the row decoder 416, the memory cell array 411 including the n-channel TFTs 401 to 404, the bit lines (data lines) 424 and 425, the word lines W1 and W2, the high voltage power supply (VDD) 422, the low voltage power supply (VSS or GND) 423, the column switches SW1 to SW4, the address lines S1 and S2, which are controlled by the column decoder 415, the output line 414, and the control line 417.

First, described is the operation of precharging a potential of the low voltage power supply (VSS or GND) taking a quarter of a reading time, in reading individual data such as an ID number which is stored in or written to a 1-bit memory cell,.

A signal is sent to the control line 417 so that the SW3 and the SW4 are selected for a quarter of a reading time to electrically connect the bit lines (data lines) 424 and 425 to the low voltage power supply (VSS or GND) 423. Thus, each of the bit lines (data lines) 424 and 425 obtains a potential of the low voltage power supply (VSS or GND).

At this time, the word lines W1 and W2 do not allow the n-channel TFTs 401 to 404 to be selected. Here, the term "be selected" indicates a state in which source terminals and drain terminals of the n-channel TFTs 401 to 404 are electrically connected to each other.

The address lines S1 and S2, which are controlled by the column decoder 415, do not allow the column switches SW1 and SW2 to be selected, either. Here, the term "be selected" indicates a state in which the bit lines (data lines) 424 and 425 are electrically connected to the output line 414.

Regarding a voltage to be precharged, depending on the circuit configuration, the system, the logic, or the like, there are various cases such as a case of precharging a potential of the low voltage power supply (VSS or GND) as in the present invention, a case of precharging a potential of the high voltage power supply (VDD), and a case of precharging a potential of a generation voltage other than the foregoing; accordingly, the voltage to be precharged is not particularly limited. The most appropriate voltage may be selected on a case-by-case basis.

Next, the operation of reading the individual data such as an ID number from the mask ROM using the present invention, taking the other three-fourths of the reading time, is described. Here, in the case where a voltage having the same level as the high voltage power supply (VDD) is output, the read individual data such as an ID number is considered as High, and in the case where a voltage having the same level as the low voltage power supply (VSS or GND) is output, the read individual data is considered as Low. Whether the read individual data such as the ID number is High or Low depends on the circuit configuration, the system, the logic, and the like, and not limited to this description.

When the word line WI is selected by the row decoder 416 and the address line S1 is selected by the column decoder 415, the n-channel TFT 401 is selected. Then, the source terminal and the drain terminal of the n-channel TFT 401 are electrically connected. That is, the bit line (data line) 424 and the high voltage power supply (VDD) 422, which are the source terminal and the drain terminal of the n-channel TFT 401, are electrically connected. The bit line 424 is charged to a voltage which is lower than the voltage of the high voltage power supply (VDD) 422, by a threshold amount of the n-channel TFT 401. Further, since the address line S1 is selected by the column decoder 415, the bit line (data line) 424 and the output line 414 are electrically connected. Here, since the bit line 424 is charged to a voltage lower than the voltage of the high voltage power supply (VDD) 422 by the threshold amount of the n-channel TFT 401, the output line 414 has a potential equal to the bit line (data line) 424. That is, the voltage which is lower than the voltage of the high voltage power supply (VDD) 422 by the threshold amount of the n-channel TFT 401 is output to the output line 414.

Although not shown, the voltage lower than the voltage of the high voltage power supply (VDD) 422 by the threshold amount of the n-channel TFT 401 is made to pass through an amplifier, thereby a potential equal to that of the high voltage power supply (VDD) is output. Here, the amplifier is a circuit capable of increasing a voltage or a current, and may have a structure where two stages of inverters are connected or a structure using a comparator or the like.

Thus, the High which is the individual data such as the ID number stored in or written to the n-channel TFT 401 is output to the output line 414.

Similarly, when the word line W1 is selected by the row decoder 416 and the address line S2 is selected by the column decoder 415, the n-channel TFT 402 is selected. One terminal of the n-channel TFT 402 is not connected to anywhere; however, by the above-described precharging operation, the bit line (data line) 425, which is the other terminal, has a potential of the low voltage power supply 423 (VSS or GND). That is, the one terminal of the n-channel TFT 402 and the other terminal thereof have almost equal potentials to the potential of the low voltage power supply (VSS or GND) 423. Further, since the address line S2 is selected by the column decoder 415, the bit line (data line) 425 and the output line 414 are electrically connected. That is, a potential almost equal to that of the low voltage power supply (VSS or GND) 423 is output to the output line 414.

Thus, the Low which is the individual data such as the ID number stored in or written to the n-channel TFT 402 is output to the output line 414.

In the above-described manner, the individual data such as the ID number stored in or written to the mask ROM can be read out.

Figure 13:
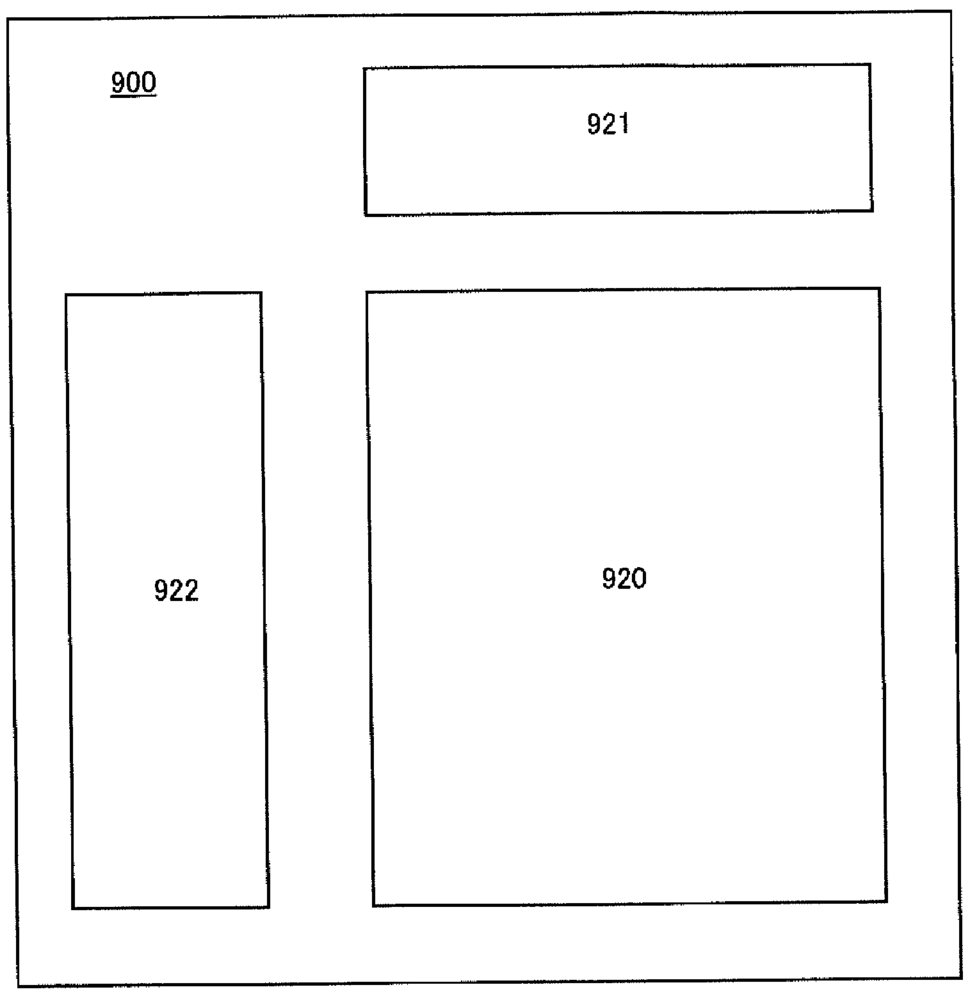
FIG. 13 is a block diagram of a semiconductor device using an IC manufactured according to an aspect of the present invention which is capable of wireless communication.

FIG. 13 is a top view of a mask ROM including a memory cell array according to the present invention. In a mask ROM 900, a memory cell array 920 (corresponding to the memory cell array 411 in FIG. 11) of the present invention is formed, and with the use of the above-described TFTs of a logic circuit, a column decoder 921 (corresponding to the column decoder 415 in FIG. 11) and a row decoder 922 (corresponding to the column decoder 416 in FIG. 11) are formed.

Figure 14:
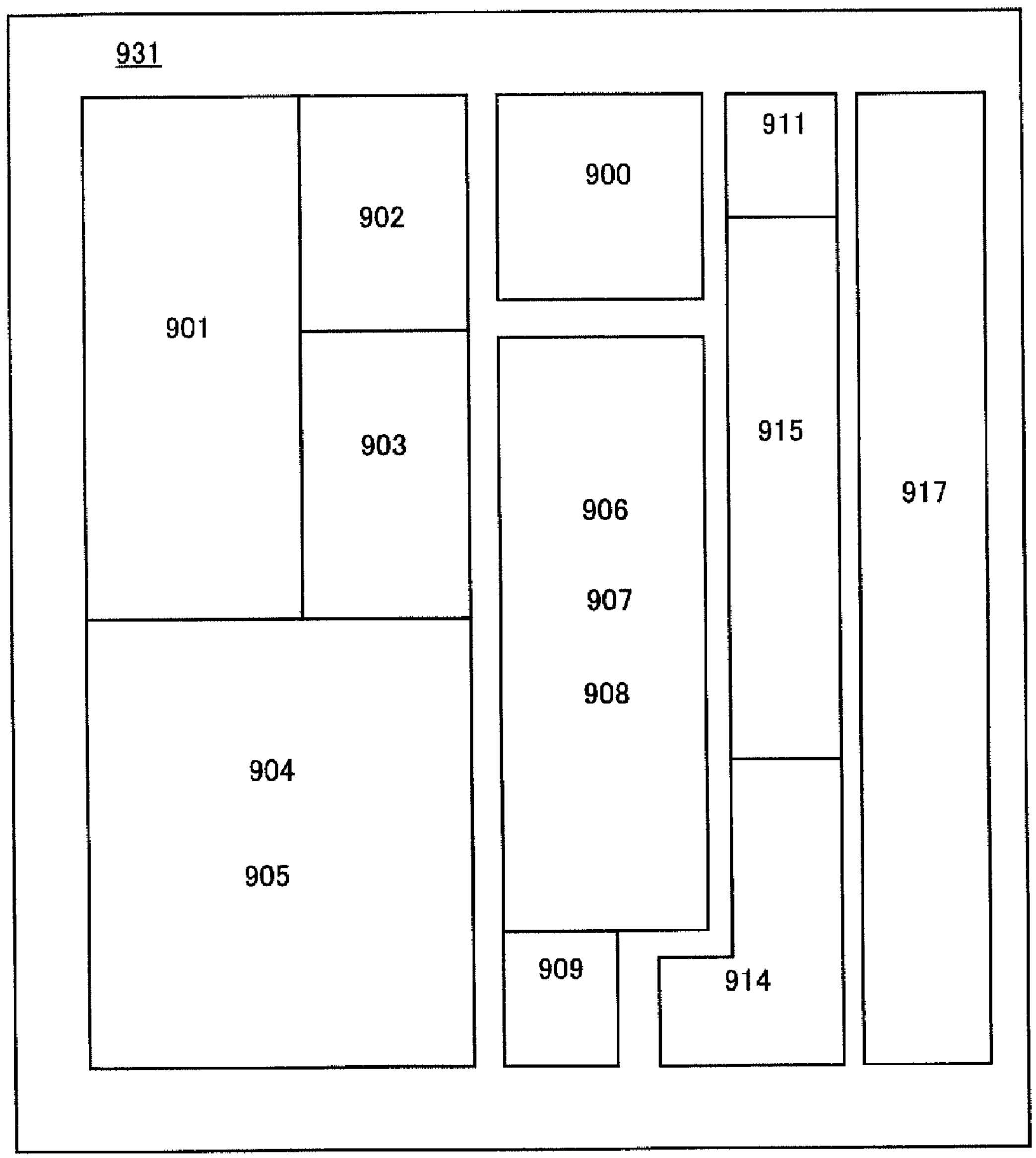
FIG. 14 is a block diagram of a semiconductor device using an IC manufactured according to an aspect of the present invention which is capable of wireless communication.

FIG. 14 shows an example of a semiconductor device, which uses an IC and is capable of wireless communication, and includes the mask ROM 900 of FIG. 13. The semiconductor device shown in FIG. 14 is just an example, and the present invention is not limited to the structure shown in FIG. 14.

A semiconductor device (also referred to as an ID chip, an IC chip, an IC tag, an ID tag, a wireless chip, or an RFID) 931 shown in FIG. 14 includes circuit blocks of an antenna 917, a high-frequency circuit 914, a power supply circuit 915, a reset circuit 911, a rectifier circuit 906, a demodulation circuit 907, an analog amplifier 908, a clock generation circuit 903, a modulation circuit 909, a signal output control circuit 901, a CRC circuit 902, a code extraction circuit 904, a code identification circuit 905, and a mask ROM 900. The power supply circuit 915 includes circuit blocks of a rectifier circuit and a storage capacitor. Further, as shown in FIG. 13, the mask ROM 900 includes the memory cell array 920, the column decoder 921, and the row decoder 922.

In accordance with this embodiment mode, a semiconductor device which includes an IC having TFTs manufactured according to the present invention and which can conduct wireless communication can be manufactured. Moreover, in accordance with this embodiment mode, tact and cost can be reduced particularly when a large number of semiconductor devices capable of wireless communication are manufactured using a large area substrate.

Note that as necessary, this embodiment can be combined with any of the embodiment modes and embodiment.

Embodiment 1

Embodiment 1 describes a concentration profile of an impurity element in TFTs manufactured according to the present invention with reference to FIGS. 16A to 16C, 17, and 18.

Figure 18:
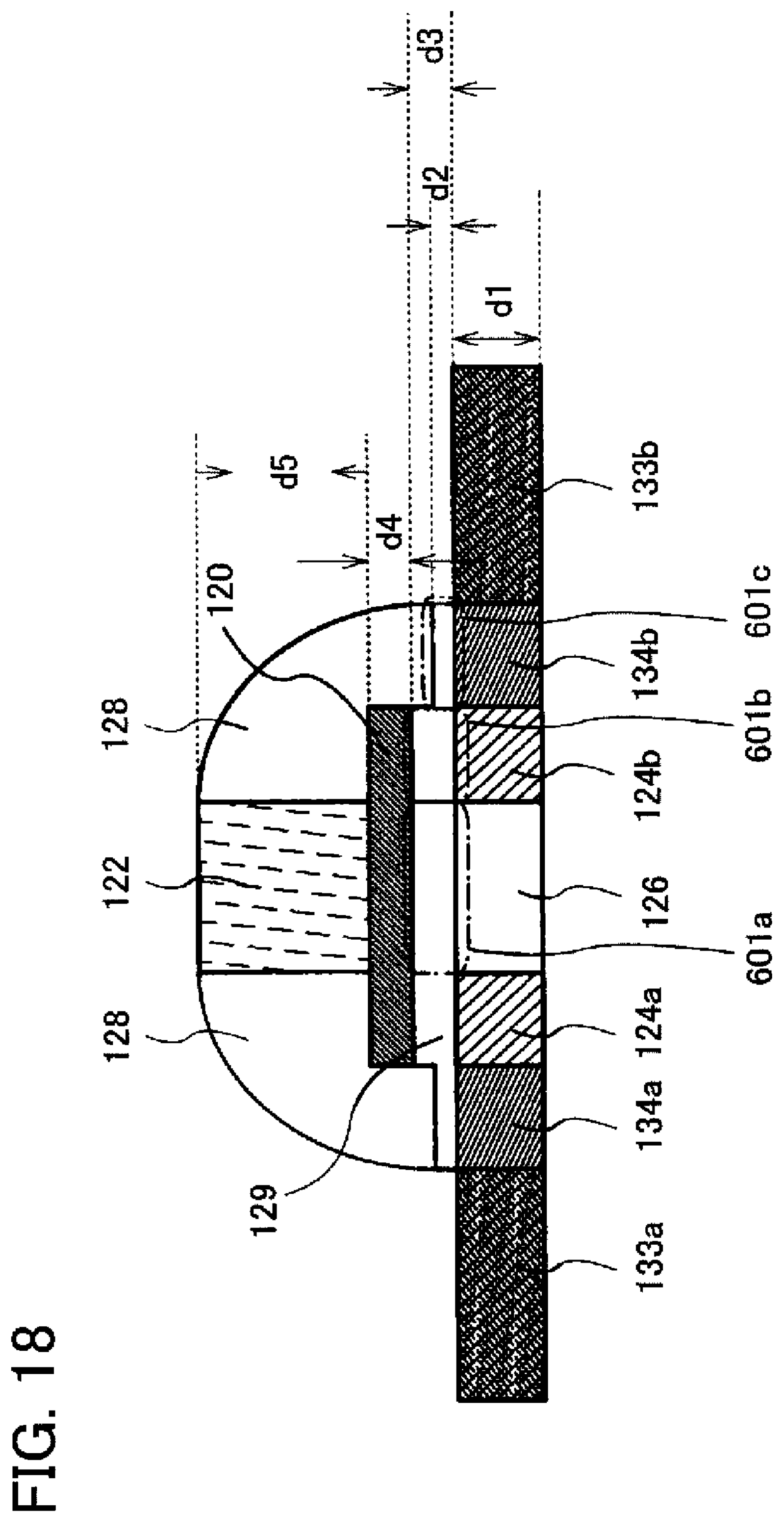
FIG. 18 illustrates a cross-sectional view of a TFT manufactured according to an aspect of the present invention.

A TFT in this embodiment is formed according to Embodiment Mode 1 (FIG. 18). Note that a silicide layer is not formed in the TFT in this embodiment. In other words, after the step of adding an impurity element illustrated in FIG. 2A, sidewalls 128 are formed and a gate insulating film 114 outside the sidewalls 128 are removed by etching to form a gate insulting film 129. However, in this etching, low concentration impurity regions 125*a* and 125*b* are not etched. Then, the step of adding an impurity element illustrated in FIG. 2E is conducted to form high concentration impurity regions 133*a* and 133*b*.

In other words, the TFT of this embodiment includes an active layer having a channel-formation region 126; the low concentration impurity regions 124*a* and 124*b*, which are Lov regions; low concentration impurity regions 134*a* and 134*b*, which are Loff regions; and high concentration impurity regions 133*a* and 133*b*, which serve source and drain regions, over a base insulting film (not shown) over a substrate.

The gate insulating film 129 is formed over the active layer, and in the gate insulating film 129, a region over the channel-formation region 126 is denoted by 601*a*, regions over the low concentration impurity regions 124*a* and 124*b*, which are Lov regions, are denoted by 601*b*, and regions over low concentration impurity regions 134*a* and 134*b*, which are Loff regions, are denoted by 601*c*. In the gate insulting film 129, the thickness of the region 601*c* over the low concentration impurity regions 134*a* and 134*b*, which are Loff regions, is smaller than over the low concentration impurity regions 124*a* and 124*b*, which are Lov regions, and over the channel-formation region 126.

A first gate electrode 120 and a second gate electrode 122 are formed over the gate insulating film 129, and the width of the first gate electrode 120 is larger than that of the second gate electrode 122. In other words, a hat-shaped gate electrode is formed.

The sidewalls 128 are formed at the side faces of the first gate electrode 120 and the second gate electrode 122, the side faces of the region 601*b* of the gate insulating film 129, and the top faces of the region 601*c* of the gate insulating film 129.

In this embodiment, a crystalline silicon film is formed as an island-shaped semiconductor film and has a thickness d1 of 66 nm. A silicon oxide film including nitrogen is used as the gate insulating film 129, the thickness d2 over the low concentration impurity regions 134*a* and 134*b* which are Loff regions is 10 nm, and the thickness d3 over the low concentration impurity regions 124*a* and 124*b*, which are Lov regions, is 20 nm.

A tantalum nitride film is used as the first gate electrode 120 and has a thickness d4 of 30 nm. A tungsten (W) film is used as the second gate electrode 122 and has a thickness d5 of 370 nm.

In this embodiment, as a result of calculation using the past data, it has been known that tantalum nitride has the capability of blocking added phosphorus which is about 1.6 times as much as the silicon oxide including nitrogen.

As described above, the thickness d3 of the gate insulating film over the low concentration impurity regions 124*a* and 124*b*, which are Lov regions, is 20 nm, and the thickness d4 of the tantalum nitride film of the first gate electrode 120 is 30 nm. In this case, when the capability of blocking added phosphorus of the stack-layer of the gate insulating film 129 and the first gate electrode 120 over the Lov region is converted to the thickness of the silicon oxide film including nitrogen, the thickness is 68 nm as represented by the expression 1.

$$20\ \text{nm}+(30\ \text{nm}\times 1.6)=68\ \text{nm} \quad \text{[Expression 1]}$$

Namely, the phosphorus concentration profile in the Loff region may be referred to the profile below 10 nm from the surface, and the concentration profile in the Lov region may be referred to the profile below 68 nm from the surface.

Figure 16A:
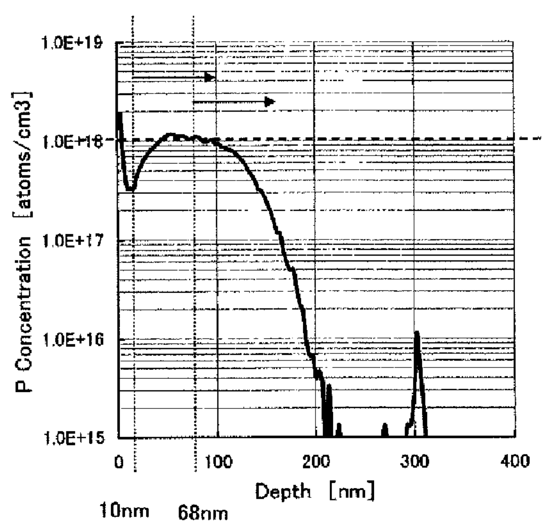
FIGS. 16A to 16C are graphs of concentration profiles of impurity elements in a TFT manufactured according to an aspect of the present invention.
Figure 16B:
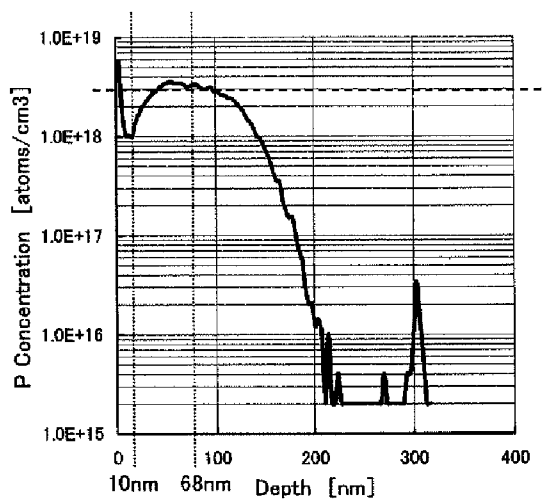
Figure 16C:
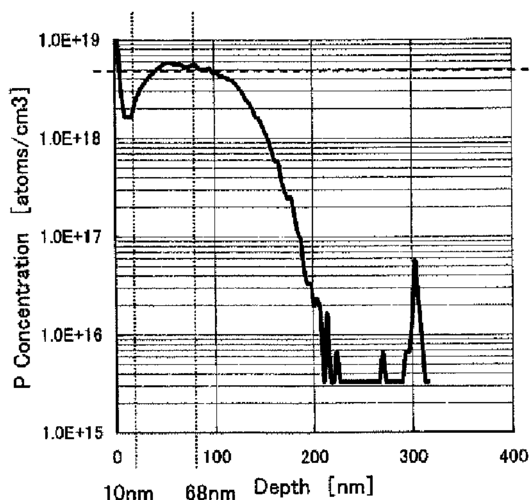

FIG. 16A shows a concentration profile when phosphorus is added under the following conditions: phosphine ($PH_3$) is diluted at 5%, the flow rate is 30 sccm, the application voltage is 80 keV, and the doze is $2.6\times10^{13}$ cm$^{-2}$ (the peak concentration is $1.0\times10^{18}$ cm$^{-3}$). FIG. 16B shows a concentration profile when phosphorus is added under the following conditions: phosphine ($PH_3$) is diluted at 5%, the flow rate is 30 sccm, the application voltage is 80 keV, and the doze is $7.9\times10^{13}$ cm$^{-2}$ (the peak concentration is $3.0\times10^{18}$ cm$^{-3}$). FIG. 16C shows a concentration profile when phosphorus is added under the following conditions: phosphine ($PH_3$) is diluted at 5%, the flow rate is 30 sccm, the application voltage is 80 keV, and the doze is $1.3\times10^{14}$ cm$^{-2}$ (the peak concentration is $5.0\times10^{18}$ cm$^{-3}$).

As illustrated in FIGS. 16A to 16C, the phosphorus concentration profile of the Loff region is not in a saturated state. In particular, the concentration of phosphorus is small in the vicinity of the surface, and increases linearly. Thus, it is found that the concentration of phosphorus in the Loff region can be controlled by the thickness of the gate insulating film 129. For example, as the thickness of the region 601*c* of the gate insulating film 129 is smaller, the concentration of phosphorus in the Loff region can be smaller.

Figure 17:
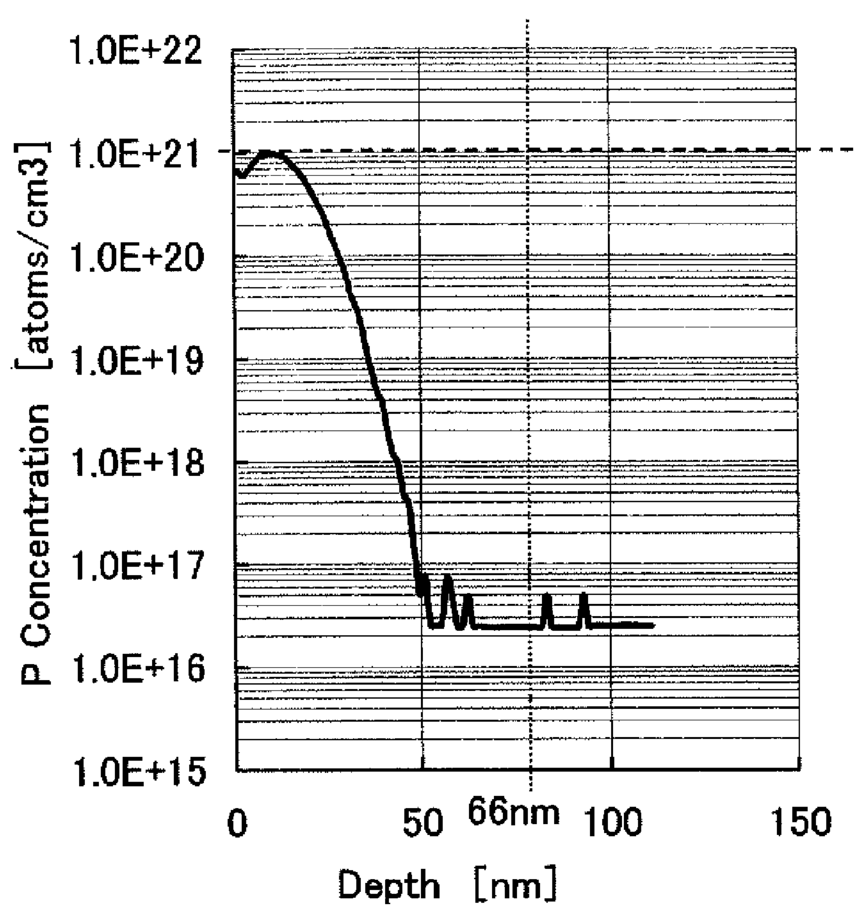
FIG. 17 is a graph of a concentration profile of impurity elements in a TFT manufactured according to an aspect of the present invention.

Moreover, FIG. 17 shows a phosphorus concentration profile of the high concentration impurity regions 133*a* and 133*b* which serve as the source and drain regions. Phosphorus (the peak concentration of $9.8\times10^{20}$ cm$^{-3}$) is added to the high concentration impurity regions 133*a* and 133*b*.

A semiconductor device and a method of manufacturing the semiconductor device, which are obtained according to the present invention include the following.

One mode of the present invention is a semiconductor device which includes an island-shaped semiconductor film having a channel-formation region, a first low-concentration impurity region, a second low-concentration impurity region, and a high-concentration impurity region including a silicide layer; a gate insulating film; a first gate electrode overlapping with the channel-formation region and the first low-concentration impurity region with the gate insulating film interposed therebetween; a second gate electrode overlapping with the channel-formation region with the gate insulating film interposed therebetween; and a sidewall formed on side surfaces of the first gate electrode and the second gate electrode. In the semiconductor device, a thickness of the gate insulating film is smaller in a region over the second low-concentration impurity region than in another region.

Another mode of the present invention is a semiconductor device which includes an island-shaped semiconductor film having a channel-formation region, a low-concentration impurity region, and a high-concentration impurity region; a gate insulating film; a gate electrode overlapping with the channel-formation region with the gate insulating film interposed therebetween; and a sidewall formed on a side surface of the gate electrode. In the semiconductor device, a thickness of the gate insulating film is smaller in a region over the low-concentration impurity region than in another region.

Another mode of the present invention is a semiconductor device which includes an island-shaped semiconductor film having a channel-formation region, a low-concentration impurity region, and a high-concentration impurity region including a silicide layer; a gate insulating film; a gate electrode overlapping with the channel-formation region with the gate insulating film interposed therebetween; and a sidewall formed on a side surface of the gate electrode. In the semiconductor device, a thickness of the gate insulating film is smaller in a region over the low-concentration impurity region than in another region.

Another mode of the present invention is a semiconductor device which includes an island-shaped semiconductor film having a channel-formation region, a first low-concentration impurity region, a second low-concentration impurity region, and a high-concentration impurity region; a gate insulating film; a first gate electrode overlapping with the channel-formation region and the first low-concentration impurity region with the gate insulating film interposed therebetween; a second gate electrode overlapping with the channel-formation region with the gate insulating film interposed therebetween; and a sidewall formed on side surfaces of the first gate electrode and the second gate electrode. In the semiconductor device, a thickness of the gate insulating film is smaller in a region over the second low-concentration impurity region than in another region.

Another mode of the present invention is a method of manufacturing a semiconductor device, which includes forming an island-shaped semiconductor film; forming a gate insulating film over the island-shaped semiconductor film; forming a first conductive film and a second conductive film over the gate insulating film; etching the second conductive film to form a third conductive film; etching the first conductive film to form a first gate electrode; etching the third conductive film to form the second gate electrode and etching a part of the gate insulating film which is a region not under the first gate electrode, so that a thickness of the part of the gate insulating film is reduced; adding an impurity element to the island-shaped semiconductor film using the second gate electrode as a mask so that the island-shaped semiconductor film has a channel-formation region under the second gate electrode, and a first low-concentration impurity region in a region overlapping with the first gate electrode, to which the impurity element is added through the first gate electrode and the gate insulating film, and so that the island-shaped semiconductor film has an impurity region in each opposing end to which the impurity element is added through only the gate insulating film; forming an insulating layer to cover the gate insulating film, the first gate electrode, and the second gate electrode; etching the insulating layer to form a sidewall on side surfaces of the first gate electrode and the second gate electrode, and to remove a region in the gate insulating film which is not covered with the sidewall in order to expose a region of the island-shaped semiconductor film which is not covered with the sidewall; forming a metal film to cover the sidewall and the region of the island-shaped semiconductor film, which is exposed; forming a silicide layer in the region of the island-shaped semiconductor film, which is exposed, by heating treatment in which the metal film and the region of the island-shaped semiconductor film, which is exposed, react; and adding an impurity element to the island-shaped semiconductor film using the sidewall, the first gate electrode, and the second gate electrode as a mask so that a high-concentration impurity region is formed in the region of the island-shaped semiconductor film, which is exposed, and a second low-concentration impurity region is formed in a part of the impurity region which is covered with the gate insulating film and the sidewall.

Another mode of the present invention is a method of manufacturing a semiconductor device, which includes forming an island-shaped semiconductor film; forming a gate insulating film over the island-shaped semiconductor film; forming a first conductive film and a second conductive film over the gate insulating film; etching the second conductive film to form a third conductive film; etching the first conductive film to form a first gate electrode; etching the third conductive film to form the second gate electrode and etching a part of the gate insulating film which is a region not under the first gate electrode, so that a thickness of the part of the gate insulating film is reduced; adding an impurity element to the island-shaped semiconductor film using the second gate electrode as a mask so that the island-shaped semiconductor film has a channel-formation region under the second gate electrode, and a first low-concentration impurity region in a region overlapping with the first gate electrode, to which the impurity element is added through the first gate electrode and the gate insulating film, and so that the island-shaped semiconductor film has an impurity region in each opposing end to which the impurity element is added through only the gate insulating film; forming an insulating layer to cover the gate insulating film, the first gate electrode, and the second gate electrode; etching the insulating layer to form a sidewall on side surfaces of the first gate electrode and the second gate electrode; and adding an impurity element to the island-shaped semiconductor film using the sidewall, the first gate electrode, and the second gate electrode as a mask so that a high-concentration impurity region is formed in a region of the island-shaped semiconductor film which is not covered with the sidewall, and a second low-concentration impurity region is formed in a part of the impurity region which is covered with the gate insulating film and the sidewall.

In the semiconductor device which is obtained according to the present invention, the silicide layer includes either an element selected from nickel, titanium, cobalt, and platinum, or at least two of those elements.

This application is based on Japanese Patent Application serial no. 2006-343412 filed in Japan Patent Office on Dec. 20, 2006, the entire contents of which are hereby incorporated by reference.

What is claimed is:

1. A semiconductor device comprising:
- an island-shaped semiconductor film, said island-shaped semiconductor film comprising:
  - a channel-formation region;
  - a high-concentration impurity region including a silicide layer;
  - a first low-concentration impurity region between the channel-formation region and the high-concentration impurity region; and
  - a second low-concentration impurity region between the first low-concentration impurity region and the high-concentration impurity region;
- a gate insulating film over the channel-formation region, the first low-concentration impurity region and the second low-concentration impurity region;
- a first gate electrode overlapping with the channel-formation region and the first low-concentration impurity region with the gate insulating film interposed therebetween;
- a second gate electrode on the first gate electrode, said second gate electrode overlapping with the channel-formation region with the gate insulating film and the first gate electrode interposed therebetween; and
- a sidewall formed on side surfaces of the first gate electrode and the second gate electrode,
- wherein a thickness of the gate insulating film is smaller in a region over the second low-concentration impurity region than in a region over the channel formation region and the first low-concentration impurity region, and
- wherein an impurity concentration of the second low-concentration impurity region is higher in a lower portion of the second low-concentration impurity region than in an upper portion of the second low-concentration impurity region.

2. The semiconductor device according to claim 1,
- wherein the suicide layer includes either an element selected from nickel, titanium, cobalt, and platinum, or at least two of those elements.

3. A semiconductor device comprising:
- an island-shaped semiconductor film, said island-shaped semiconductor film comprising:
  - a channel-formation region;
  - a high-concentration impurity region, and
  - a low-concentration impurity region between the channel-formation region and the high-concentration impurity region;
- a gate insulating film over the channel-formation region and the low-concentration impurity region;
- a gate electrode overlapping with the channel-formation region with the gate insulating film interposed therebetween; and
- a sidewall formed on a side surface of the gate electrode,
- wherein a thickness of the gate insulating film is smaller in a region over the low- concentration impurity region than in a region over the channel-formation region, and
- wherein an impurity concentration of the second low-concentration impurity region is higher in a lower portion of the second low-concentration impurity region than in an upper portion of the second low-concentration impurity region.

4. A semiconductor device comprising:
- an island-shaped semiconductor film, said island-shaped semiconductor film comprising:
  - a channel-formation region;
  - a high-concentration impurity region including a suicide layer; and
  - a low-concentration impurity region between the channel-formation region and the high-concentration impurity region;
- a gate insulating film over the channel-formation region and the low-concentration impurity region;
- a gate electrode overlapping with the channel-formation region with the gate insulating film interposed therebetween; and
- a sidewall formed on a side surface of the gate electrode,
- wherein a thickness of the gate insulating film is smaller in a region over the low- concentration impurity region than in a region over the channel-formation region, and
- wherein an impurity concentration of the second low-concentration impurity region is higher in a lower portion of the second low-concentration impurity region than in an upper portion of the second low-concentration impurity region.

5. The semiconductor device according to claim 4, wherein the silicide layer includes either an element selected from nickel, titanium, cobalt, and platinum, or at least two of those elements.

6. A semiconductor device comprising:

an island-shaped semiconductor film, said island-shaped semiconductor film comprising:

a channel-formation region;

a high-concentration impurity region;

a first low-concentration impurity region between the channel-formation region and the high concentration impurity region; and a second low-concentration impurity region between the first low-concentration impurity region and the high-concentration impurity region;

a gate insulating film over the channel-formation region, the first low-concentration impurity region and the second low-concentration impurity region;

a first gate electrode on the gate insulating film, said first gate electrode overlapping with the channel-formation region and the first low-concentration impurity region with the gate insulating film interposed therebetween;

a second gate electrode overlapping with the channel-formation region with the gate insulating film and the first gate electrode interposed therebetween; and a sidewall formed on side surfaces of the first gate electrode and the second gate electrode, wherein a thickness of the gate insulating film is smaller in a region over the second low- concentration impurity region than in a region over the channel formation region and the first low-concentration impurity region, and wherein an impurity concentration of the second low-concentration impurity region is higher in a lower portion of the second low-concentration impurity region than in an upper portion of the second low-concentration impurity region.

* * * * *